(12) United States Patent
Lee et al.

(10) Patent No.: US 11,839,121 B2
(45) Date of Patent: Dec. 5, 2023

(54) DISPLAY PANEL

(71) Applicant: Samsung Display Co., Ltd., Yongin-si (KR)

(72) Inventors: Minku Lee, Yongin-si (KR); Jihyun Ka, Yongin-si (KR); Kwangsae Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 385 days.

(21) Appl. No.: 17/209,833

(22) Filed: Mar. 23, 2021

(65) Prior Publication Data

US 2021/0210585 A1  Jul. 8, 2021

Related U.S. Application Data

(63) Continuation of application No. 16/426,049, filed on May 30, 2019, now Pat. No. 10,964,771.

(30) Foreign Application Priority Data

Nov. 2, 2018 (KR) .................. 10-2018-0133908

(51) Int. Cl.
*H10K 59/131* (2023.01)
*H10K 59/123* (2023.01)
*G09G 3/3225* (2016.01)

(52) U.S. Cl.
CPC ......... *H10K 59/131* (2023.02); *G09G 3/3225* (2013.01); *H10K 59/123* (2023.02)

(58) Field of Classification Search
CPC ............ H01L 27/3248; H01L 27/3276; H10K 50/131; H10K 59/123; G09G 3/3225
See application file for complete search history.

(56) References Cited

U.S. PATENT DOCUMENTS

| | | | |
|---|---|---|---|
| 7,136,138 B1 | 11/2006 | Sekiguchi et al. | |
| 9,940,888 B2 | 4/2018 | Ryoo et al. | |
| 10,134,826 B2 | 11/2018 | Ka et al. | |
| 2005/0140306 A1 | 6/2005 | Park | |
| 2008/0225216 A1 | 9/2008 | Shimodaira | |

(Continued)

FOREIGN PATENT DOCUMENTS

| | | |
|---|---|---|
| EP | 3 226 101 | 10/2017 |
| EP | 3 232 431 | 10/2017 |

(Continued)

OTHER PUBLICATIONS

Extended European Search Report corresponding to European Patent Application No. 19204933.6 dated Jan. 7, 2020.

*Primary Examiner* — Suberr L Chi
(74) *Attorney, Agent, or Firm* — KILE PARK REED & HOUTTEMAN PLLC

(57) ABSTRACT

A display panel including a substrate including a display area surrounding an opening area and a non-display area between the opening area and the display area; a plurality of display elements on the display area; a plurality of scan lines extending in a first direction and detouring around an edge of the opening area; a plurality of data lines extending in a second direction that intersects with the first direction, the plurality of data lines detouring around the edge of the opening area; and a plurality of emission control lines extending in the first direction and detouring around the edge of the opening area.

20 Claims, 23 Drawing Sheets

(56) References Cited

U.S. PATENT DOCUMENTS

| | | |
|---|---|---|
| 2012/0105412 A1 | 5/2012 | Kang et al. |
| 2017/0287992 A1 | 10/2017 | Kwak et al. |
| 2017/0294502 A1 | 10/2017 | Ka et al. |
| 2018/0144684 A1 | 5/2018 | Jeon et al. |
| 2020/0058728 A1* | 2/2020 | Song .................... H10K 59/131 |
| 2020/0098843 A1* | 3/2020 | Jeon ....................... H10K 50/80 |

FOREIGN PATENT DOCUMENTS

| | | |
|---|---|---|
| KR | 10-2014-0086708 | 7/2014 |
| KR | 10-2017-0064598 | 6/2017 |
| KR | 10-2017-0117291 | 10/2017 |
| KR | 10-2018-0056442 | 5/2018 |

* cited by examiner

DISPLAY PANEL

CROSS-REFERENCE TO RELATED APPLICATION(S)

This is a continuation application of U.S. patent application Ser. No. 16/426,049 filed May 30, 2019 (now pending), the disclosure of which is incorporated herein by reference in its entirety. U.S. patent application Ser. No. 16/426,049 claims priority benefit of Korean Patent Application 10-2018-0133908 filed Nov. 2, 2018 in the Korean Intellectual Property Office, the disclosure of which is incorporated herein by reference in its entirety for all purposes.

BACKGROUND

1. Field

Embodiments relate to a display panel.

2. Description of the Related Art

Recently, display devices have diversified in terms of purpose and functionality. In addition, as display devices have become thinner and more lightweight, their range of use has gradually increased.

As a display device is variously utilized, there may be various methods in designing a shape of a display device and also, the variety of functions that may be combined or associated with the display device is increasing.

SUMMARY

The embodiments may be realized by providing a display panel including a substrate including a display area surrounding an opening area and a non-display area between the opening area and the display area; a plurality of display elements on the display area; a plurality of scan lines extending in a first direction and detouring around an edge of the opening area; a plurality of data lines extending in a second direction that intersects with the first direction, the plurality of data lines detouring around the edge of the opening area; and a plurality of emission control lines extending in the first direction and detouring around the edge of the opening area.

A detouring portion of a first emission control line among the plurality of emission control lines may be between detouring portions of neighboring data lines among the plurality of data lines on the non-display area.

A detouring portion of a first scan line among the plurality of scan lines may be between the detouring portions of the neighboring data lines among the plurality of data lines on the non-display area.

The detouring portion of the first scan line and the detouring portion of the first emission control line may be spaced apart from each other by a predetermined interval between the detouring portions of the neighboring data lines.

The display panel may further include a plurality of previous scan lines extending in the first direction and detouring around the edge of the opening area, wherein one of the plurality of previous scan lines is connected to the detouring portion of the first scan line.

A second emission control line that is adjacent to the first emission control line among the plurality of emission control lines may be connected to the detouring portion of the first emission control line.

Each of the display elements may be connected to a pixel circuit, the pixel circuit including: a switching thin film transistor connected to one of the plurality of scan lines and one of the plurality of data lines; a driving thin film transistor electrically connected to the switching thin film transistor and through which a driving current flows in response to a data signal of the switching thin film transistor; and a control thin film transistor electrically connected to the driving thin film transistor, wherein the first emission control line may be electrically connected to a gate electrode of the control thin film transistor.

The control thin film transistor may include an emission control thin film transistor connected to the driving thin film transistor and configured to transfer the driving current to the display element electrically connected to the driving thin film transistor.

The display panel may further include a plurality of voltage lines extending in the second direction and providing a driving voltage to the display element, wherein the control thin film transistor includes an operation control thin film transistor connecting the driving thin film transistor with the voltage line corresponding to the driving thin film transistor.

The first emission control line may include an extension portion that passes across the display area, the display panel further including an insulating layer between the detouring portion of the first emission control line and the extension portion, and the detouring portion of the first emission control line may contact the extension portion through a contact hole of the insulating layer.

The detouring portion of the first emission control line may be on a same layer on which a pixel electrode is arranged, the pixel electrode being provided to each of the plurality of display elements.

The display panel may further include an upper insulating layer between the detouring portion of the first emission control line and the plurality of data lines, wherein the detouring portion of the first emission control line is between the insulating layer and the upper insulating layer.

The display panel may further include a plurality of initialization voltage lines spaced apart from each other around the opening area.

The plurality of initialization voltage lines may be connected to each other through an electrode layer that has a ring shape and is on the non-display area.

Initialization voltage lines located on a first side of the opening area among the plurality of initialization voltage lines may be connected to each other through an electrode layer of a bar type on the non-display area.

The embodiments may be realized by providing a display panel including a substrate including an opening area, a display area surrounding the opening area, and a non-display area between the opening area and the display area; a plurality of display elements on the display area, each display element including a pixel electrode, an opposite electrode facing the pixel electrode, and an emission layer between the pixel electrode and the opposite electrode; a plurality of first lines extending in a first direction and detouring around along an edge of the opening area; a plurality of second lines extending in a second direction that intersects with the first direction and detouring around along the edge of the opening area; and a plurality of third lines extending in the first direction and detouring around along the edge of the opening area, wherein at least one of the plurality of third lines includes extension portions spaced apart from each other around the opening area; an insulating layer on the extension portions; and a detouring portion connected to the extension portions through contact holes of the insulating layer, and wherein the detouring portion is between detouring portions of neighboring second lines on the non-display area.

Each of the plurality of first lines may include a scan line, and each of the plurality of second lines may include a data line.

Each of the plurality of third lines may include an emission control line.

The detouring portion may include a same material as that of the pixel electrode.

Each of the display elements may be connected to a driving thin film transistor, a storage capacitor including a first storage capacitor plate and a second storage capacitor plate, and a voltage line configured to provide a voltage to the second storage capacitor plate, and the detouring portion may include a same material as that of the second storage capacitor plate.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
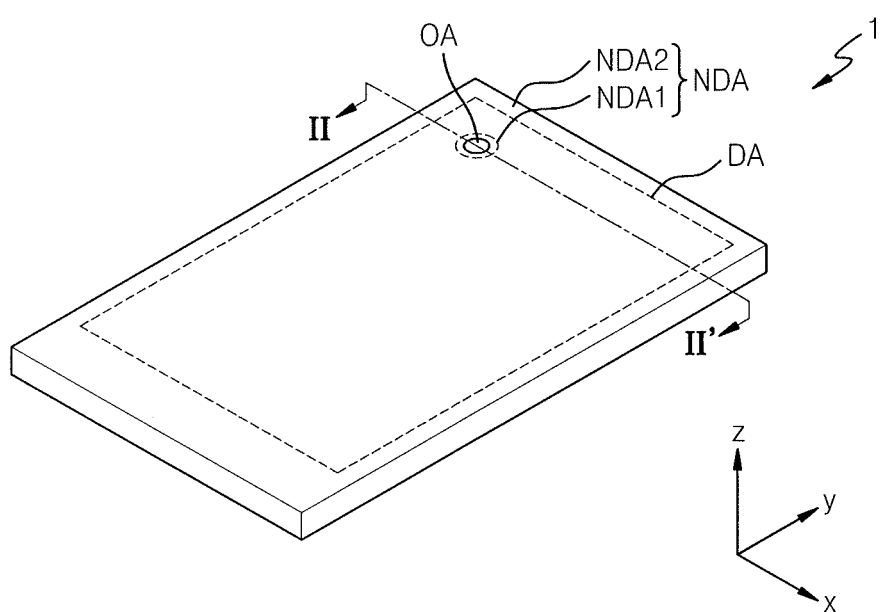
FIG. 1 illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the terms "or" and "and/or" include any and all combinations of one or more of the associated listed items. For example, "at least one of a, b and c" may be understood that only a, only b, only c, both a and b, both a and c, both b and c, all of a, b, and c, or variations thereof.

Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

Embodiments may prevent a wiring, etc. arranged outside a display area from being viewed due to external light. However, it should be understood that effects described herein should be considered in a descriptive sense only and not for limitation of the disclosure.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

FIG. 1 illustrates a perspective view of a display device 1 according to an embodiment.

Referring to FIG. 1, the display device 1 may include a display area DA that emits light, and a non-display area NDA that does not emit light. The non-display area NDA neighbors the display area DA. The display device 1 may provide a predetermined image by using light emitted from a plurality of pixels arranged in the display area DA.

The display device 1 may include an opening area (or a first area) OA that is at least partially surrounded by the display area (or a second area) DA. In an implementation, as illustrated in FIG. 1, the opening area OA may be entirely surrounded by the display area DA. The non-display area NDA may include a first non-display area NDA1 (or a third area) surrounding the opening area OA, and a second non-display area (or a fourth area) NDA2 surrounding an outer periphery of the display area DA. In an implementation, the first non-display area NDA1 may entirely surround the opening area OA, the display area DA may entirely surround the first non-display area NDA1, and the second non-display area NDA2 may entirely surround the display area DA.

In an implementation, an organic light-emitting display device is exemplarily described as the display device 1 according to an embodiment below. In an implementation, various types of display devices such as a liquid-crystal display, an inorganic light-emitting display and a quantum dot light-emitting display may be used.

In an implementation, as illustrated in FIG. 1, one opening area OA may be arranged in an upper left side of the display area DA. In an implementation, the number of opening areas OA and a location of the opening area OA may be variously modified.

Figure 2:
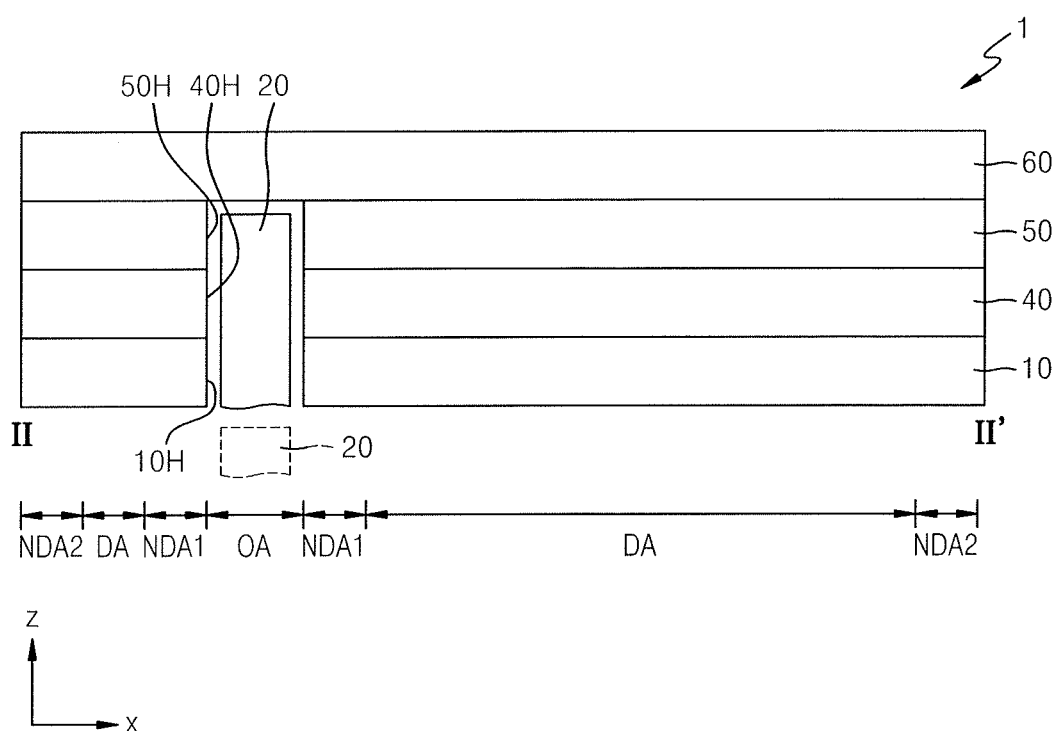
FIG. 2 illustrates a cross-sectional view of a display device according to an embodiment.

FIG. 2 illustrates a cross-sectional view of the display device 1 according to an embodiment and corresponds to a cross-section taken along line II-II' of FIG. 1.

Referring to FIG. 2, the display device 1 may include a display panel 10, an input sensing layer 40 on the display panel 10, and an optical functional layer (or anti-reflection layer) 50. These layers may be covered by a window 60. The display device 1 may include various electronic devices such as mobile phones, notebook computers, and smartwatches.

The display panel 10 may display an image. The display panel 10 may be pixels arranged in the display area DA. Each of the pixels may include a display element and a pixel circuit connected thereto. The display element may include a liquid crystal, an organic light-emitting diode, an inorganic light-emitting diode, or a quantum dot light-emitting diode, etc.

The input sensing layer 40 may obtain coordinate information corresponding to an external input, e.g., a touch event. The input sensing layer 40 may include a sensing electrode (or a touch electrode) and trace lines connected to the sensing electrode. The input sensing layer 40 may be arranged on the display panel 10. The input sensing layer 40 may sense an external input using a mutual cap method and/or a self cap method.

The input sensing layer 40 may be directly formed on the display panel 10 or may be formed separately and then coupled by using an adhesive layer such as an optical clear adhesive (OCA). For example, the input sensing layer 40 may be successively formed after a process of forming the display panel 10. In this case, the adhesive layer may not be arranged between the input sensing layer 40 and the display panel 10. In an implementation, as illustrated in FIG. 2, the input sensing layer 40 may be arranged between the display panel 10 and the optical functional layer 50. In an implementation, the input sensing layer 40 may be arranged on the optical functional layer 50.

The optical functional layer 50 may include a reflection prevention layer. The reflection prevention layer may reduce reflectivity of light (external light) incident from the outside toward the display panel 10 through the window 60. The reflection prevention layer may include a retarder and a polarizer. The retarder may include a film type retarder or a liquid crystal type retarder. The retarder may include a λ/2 retarder and/or a λ/4 retarder. The polarizer may include a film type polarizer or a liquid crystal type polarizer. The film type polarizer may include a stretchable synthetic resin film, and the liquid crystal type polarizer may include liquid crystals arranged in a predetermined arrangement. Each of the retarder and the polarizer may further include a protective film. The retarder and the polarizer themselves or their protective films may be defined as a base layer of the reflection prevention layer.

In an implementation, the reflection prevention layer may include a black matrix and color filters. The color filters may be arranged by taking into account colors of light emitted respectively from pixels of the display panel 10. In another embodiment, the reflection prevention layer may include a destructive interference structure. The destructive interference structure may include a first reflection layer and a second reflection layer respectively arranged in different layers. First reflected light and second reflected light respectively reflected by the first reflection layer and the second reflection layer may create destructive-interference and thus reflectivity of external light may be reduced.

The optical functional layer 50 may include a lens layer. The lens layer may help improve emission efficiency of light emitted from the display panel 10 or reduce color deviation of the light. The lens layer may include a layer having a concave or convex lens shape and/or include a plurality of layers respectively having different refractive indexes. The optical functional layer 50 may include both the reflection prevention layer and the lens layer or include one of the reflection prevention layer and the lens layer.

The display panel 10, the input sensing layer 40, and/or the optical functional layer 50 may include an opening. With regard to this, FIG. 2 shows that the display panel 10, the input sensing layer 40, and the optical functional layer 50 respectively include first to third openings 10H, 40H, and 50H and that the first to third openings 10H, 40H, and 50H thereof overlap (e.g., are aligned with) each other. The first to third openings 10H, 40H, and 50H may correspond to the opening area OA. In an implementation, at least one of the display panel 10, the input sensing layer 40, and the optical functional layer 50 may not include an opening. For example, one or two of the display panel 10, the input sensing layer 40, and the optical functional layer 50 may not include an opening. Hereinafter, the opening area OA may denote at least one of the first to third openings 10H, 40H, and 50H respectively of the display panel 10, the input sensing layer 40, and the optical functional layer 50. For example, in the present specification, the opening area OA may denote the first opening 10H of the display panel 10.

A component 20 may correspond to, be located in, be aligned with, or overlap an opening area OA. As shown by a solid line of FIG. 2, the component 20 may be located inside the first to third openings 10H, 40H, and 50H, or as shown by a dashed line, the component 20 may be located below the display panel 10. In an implementation, the opening area OA may be understood as a component area.

The component 20 may include an electronic element. For example, the component 20 may include an electronic element that uses light or sounds. For example, an electronic element may be a sensor such as an infrared sensor that emits and/or receives light, a camera that receives light and captures an image, a sensor that outputs and senses light or sounds to measure a distance or recognize a fingerprint, a small lamp that outputs light, or a speaker that outputs sounds. An electronic element that uses light may use light in various wavelength bands such as visible light, infrared light, and ultraviolet light. In an implementation, the opening area OA may be understood as a transmission area through which light and/or sounds, which are output from the component 20 to the outside or propagate toward the electronic element from the outside, may pass.

In an implementation, in the case where the display device 1 is used as a smartwatch or an instrument panel for an automobile, the component 20 may be a member including hands of a clock or a needle, etc. indicating predetermined information (e.g. the velocity of a vehicle, etc.). In the case where the display device 1 includes hands of a clock or a needle of an instrument panel for an automobile, the component 20 may be exposed to the outside through the window 60, which may include an opening corresponding to the opening area OA.

As described above, the component 20 may include element(s) related to a function of the display panel 10 or an element such as an accessory that increases an esthetic sense of the display panel 10. In an implementation, a layer including an OCA, etc. may be located between the window 60 and the optical functional layer 50.

Figure 3A:
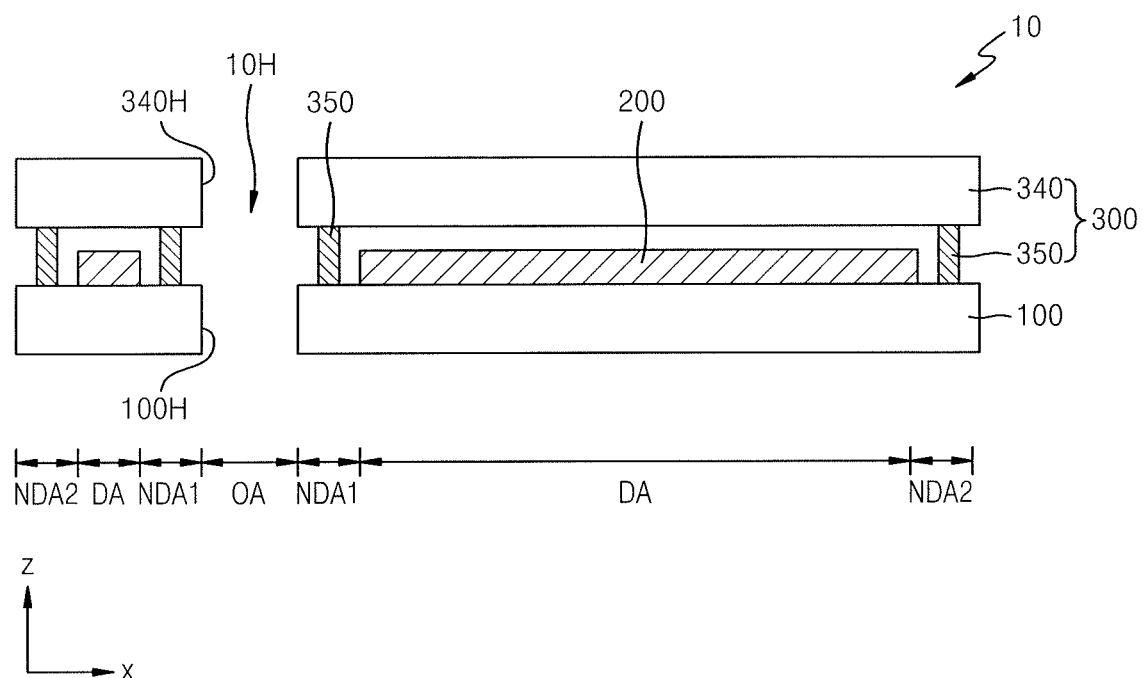
FIGS. 3A to 3C illustrate cross-sectional views of a display panel according to an embodiment.
Figure 3B:
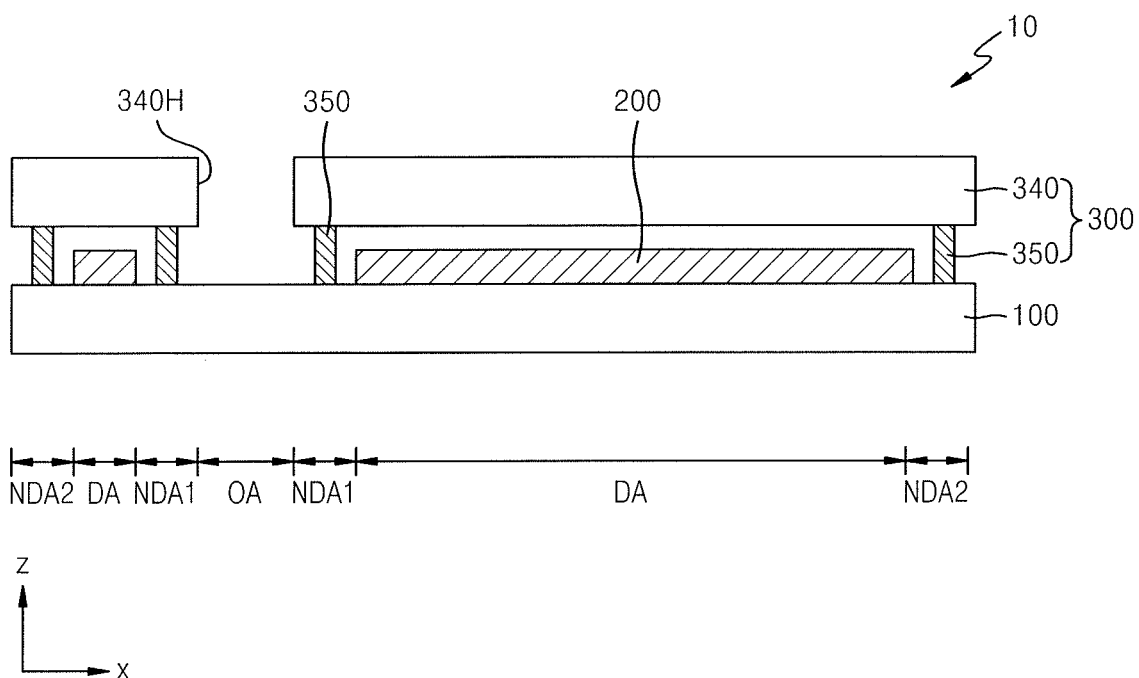
Figure 3C:
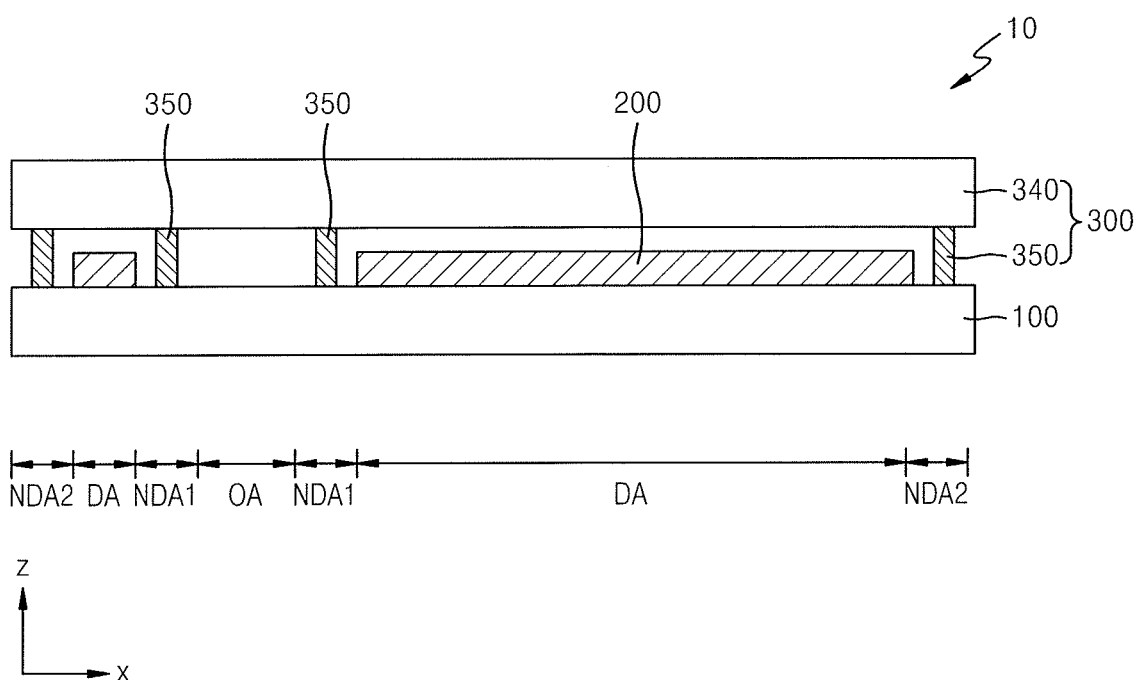

FIGS. 3A to 3C illustrate cross-sectional views of the display panel 10 according to an embodiment.

Referring to FIGS. 3A to 3C, the display panel 10 may include a display element layer 200 on a substrate 100. The substrate 100 may include a glass material or a polymer resin. For example, the substrate 100 may include a glass material containing $SiO_2$ as a main component or may include a resin such as a reinforced plastic.

The display element layer 200 may correspond to the display area DA and may include a plurality of pixels. The display element layer 200 may include a pixel circuit corresponding to each pixel and a display element electrically connected to the pixel circuit. The pixel circuit may include a thin film transistor and a storage capacitor, and the display element may include an organic light-emitting diode OLED.

The display element layer 200 may include, as an encapsulation member 300, an encapsulation substrate 340 facing the substrate 100. A sealing material 350 may be between the substrate 100 and the encapsulation substrate 340. The sealing material 350 may surround the display element layer 200 between the substrate 100 and the encapsulation substrate 340. For example, the sealing material 350 may surround a first edge (also referred to as an inner edge) of the display element layer 200 in the first non-display area NDA1 and surrounds a second edge (also referred to as an outer edge) of the display element layer 200 in the second non-display area NDA2. When viewed in a direction perpendicular to a main surface of the substrate 100, the opening area OA may be entirely surrounded by the sealing material 350, and the second edge of the display element layer 200 may be also entirely surrounded by the sealing material 350.

The display panel 10 may include the first opening 10H corresponding to the opening area OA. With regard to this, it is shown in FIG. 3A that the substrate 100 and the encapsulation substrate 340 respectively include through holes 100H and 340H corresponding to the opening area OA. The display element layer 200 may also include a through hole corresponding to the opening area OA.

In an implementation, as shown in FIG. 3B, the encapsulation substrate 340 may include a through hole 340H corresponding to the opening area OA, but the substrate 100 may not include a through hole. In an implementation, as shown in FIG. 3C, the substrate 100 and the encapsulation substrate 340 may not respectively include through holes corresponding to the opening area OA. The display element layer 200 may include a through hole corresponding to the opening area OA. In an implementation, the sealing material 350 arranged in the first non-display area NDA1 of the display panel 10 may be omitted. In an implementation, the display element layer 200 may not include a through hole corresponding to the opening area OA. The component 20 (see FIG. 2) that does not require a relatively high transmittance may be arranged in the opening area OA, and the opening area OA may be used as a transmission area that transmits light used by the component 20. Even when the display element layer 200 does not include a through hole corresponding to the opening area OA, a portion of the display element layer 200 that corresponds to the opening area OA may secure transmittance by not including elements (e.g. a transistor, a storage capacitor, a wiring, etc.) constituting a pixel circuit PC (see FIGS. 6 and 7A).

Figure 4A:
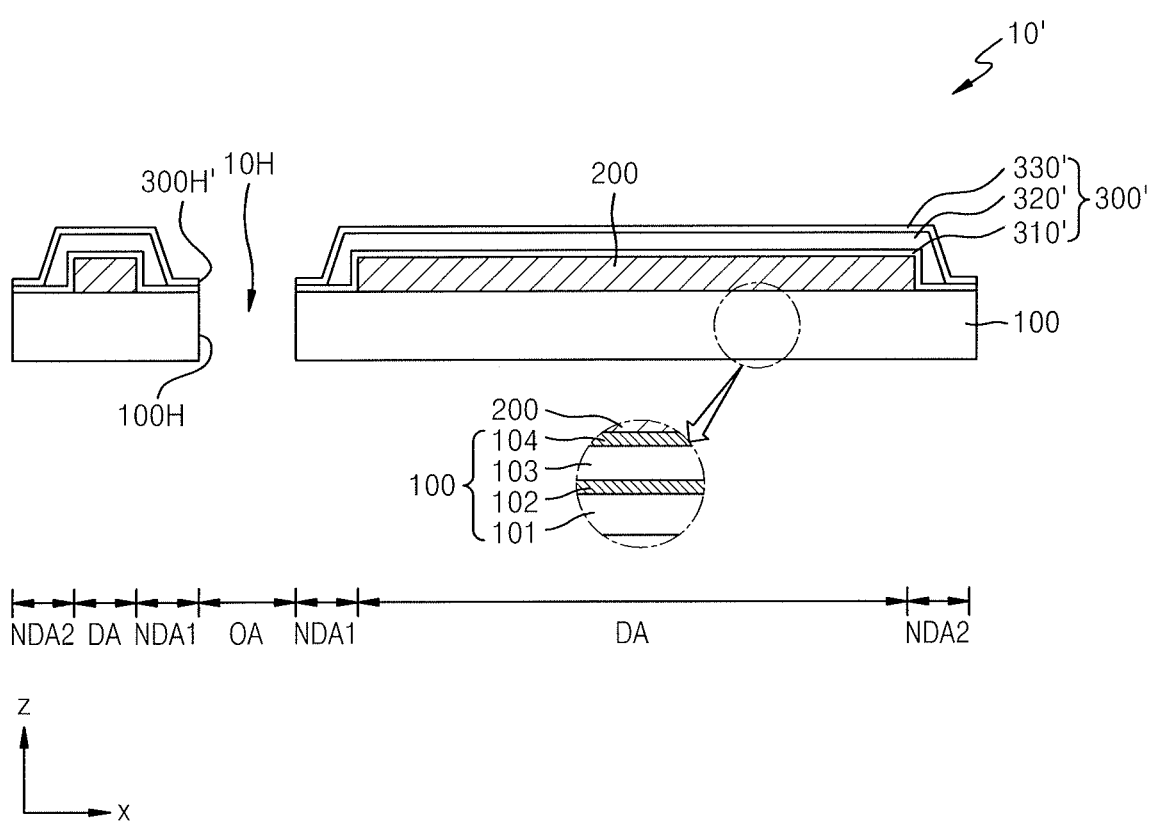
FIGS. 4A to 4C illustrate cross-sectional views of a display panel according to another embodiment.
Figure 4B:
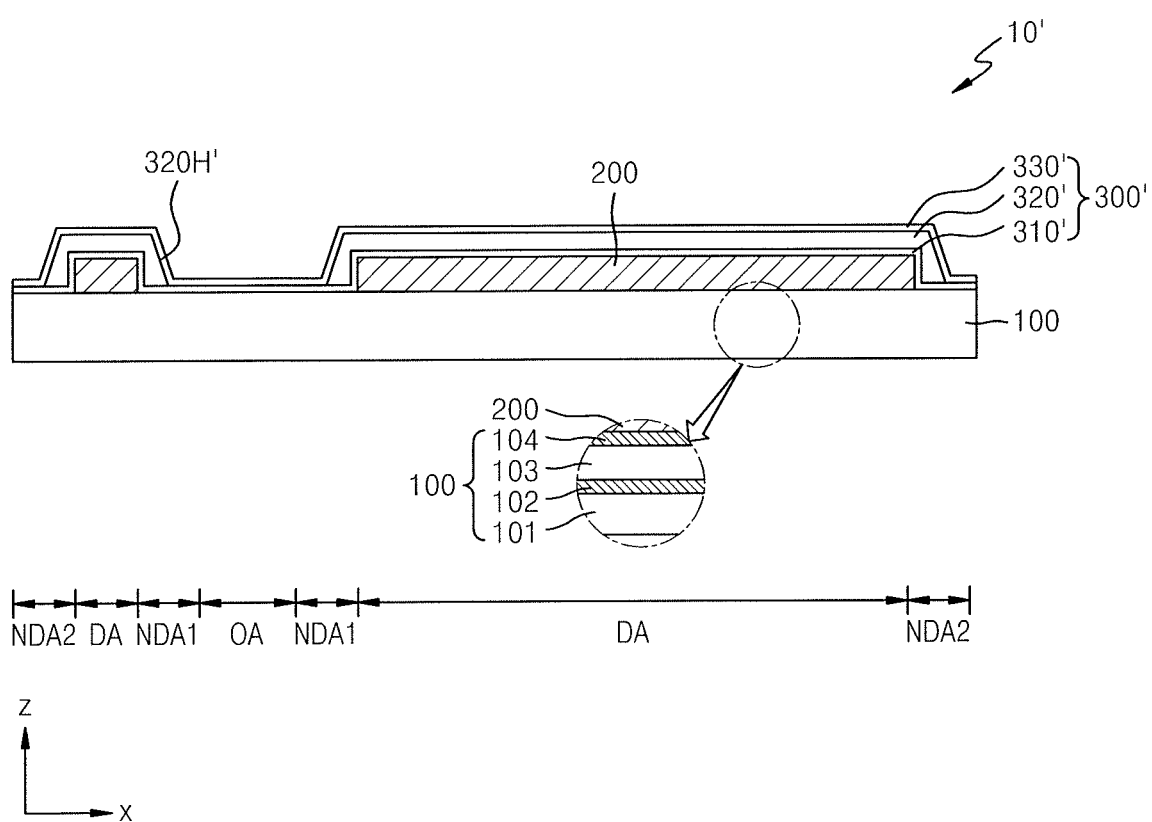
Figure 4C:
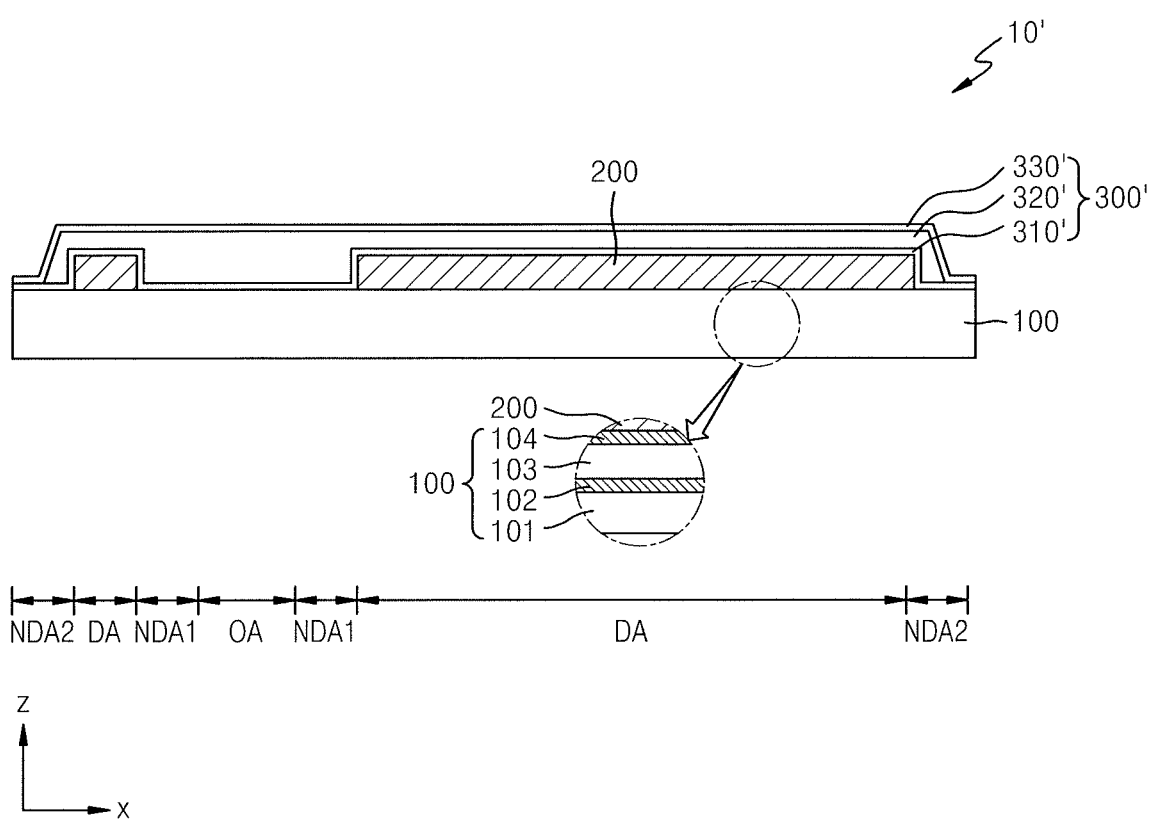

FIGS. 4A to 4C are cross-sectional views of the display panel 10 according to another embodiment.

Referring to FIG. 4A, the display element layer 200 may be on the substrate 100. The display element layer 200 may be covered by a thin-film encapsulation layer as an encapsulation member 300'. The encapsulation member 300', which is the thin-film encapsulation layer, may include at least one inorganic encapsulation layer and at least one organic encapsulation layer. In an implementation, as shown in FIG. 4A, first and second inorganic encapsulation layers 310' and 330' may be present, and an organic encapsulation layer 320' may be therebetween.

The first and second inorganic encapsulation layers 310' and 330' may include one or more inorganic materials among aluminum oxide, titanium oxide, tantalum oxide, hafnium oxide, zinc oxide, silicon oxide, silicon nitride, and silicon oxynitride. The organic encapsulation layer 320' may include a polymer-based material. The polymer-based material may include an acrylic-based resin, an epoxy-based resin, polyimide, and polyethylene.

The substrate 100 may include a polymer resin and include a multi-layer. For example, the substrate 100 may include a first base layer 101, a first barrier layer 102, a second base layer 103, and a second barrier layer 104 that are sequentially stacked.

Each of the first and second base layers 101 and 103 may include a polymer resin. For example, the first and second base layers 101 and 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), and cellulose acetate propionate (CAP). The polymer resin may be transparent.

Each of the first and second barrier layers 102 and 104 may include a barrier layer configured to prevent penetration of external foreign substances and include a single layer or a multi-layer including an inorganic material such as silicon nitride ($SiN_x$, $x>0$), silicon oxide ($SiO_x$, $x>0$), and/or silicon oxynitride.

In the case where a display panel 10' includes the substrate 100, which includes a multi-layer, and an encapsulation member 300', which is the thin-film encapsulation layer, the flexibility of the display panel 10' may be improved.

In an implementation, as illustrated in FIG. 4A, through holes 100H and 300H that respectively pass through the substrate 100 and the encapsulation member 300', which is the thin-film encapsulation layer, may be provided, the through holes 100H and 300H' corresponding to the first opening 10H of the display panel 10'. The display element layer 200 may also include a through hole corresponding to the opening area OA.

In an implementation, as shown in FIG. 4B, an organic encapsulation layer 320' of the encapsulation member 300', which is the thin-film encapsulation layer, may include a through hole 320H' corresponding to the opening area OA, but the substrate 100 and first and second inorganic encapsulation layers 310' and 330' may not respectively include through holes. In an implementation, as shown in FIG. 4C, layers constituting the encapsulation member 300', which is the thin-film encapsulation layer, may not include through holes corresponding to the opening area OA. For example, the first and second inorganic encapsulation layers 310' and 330' and the organic encapsulation layer 320' may cover the opening area OA. In an implementation, in the case where the opening area OA is used as a transmission area that transmits light, for example, in the case where the component 20 (see FIG. 2) that does not require a high transmittance is arranged in the opening area OA, the display element layer 200 may not include a through hole corresponding to the opening area OA unlike that shown in FIGS. 4A to 4C. Even when the display element layer 200 does not include a through hole corresponding to the opening area OA, a portion of the display element layer 200 that corresponds to the opening area OA may secure transmittance by not including elements (e.g. a transistor, a storage capacitor, a wiring, etc.) constituting the pixel circuit PC (see FIG. 6).

Figure 5:
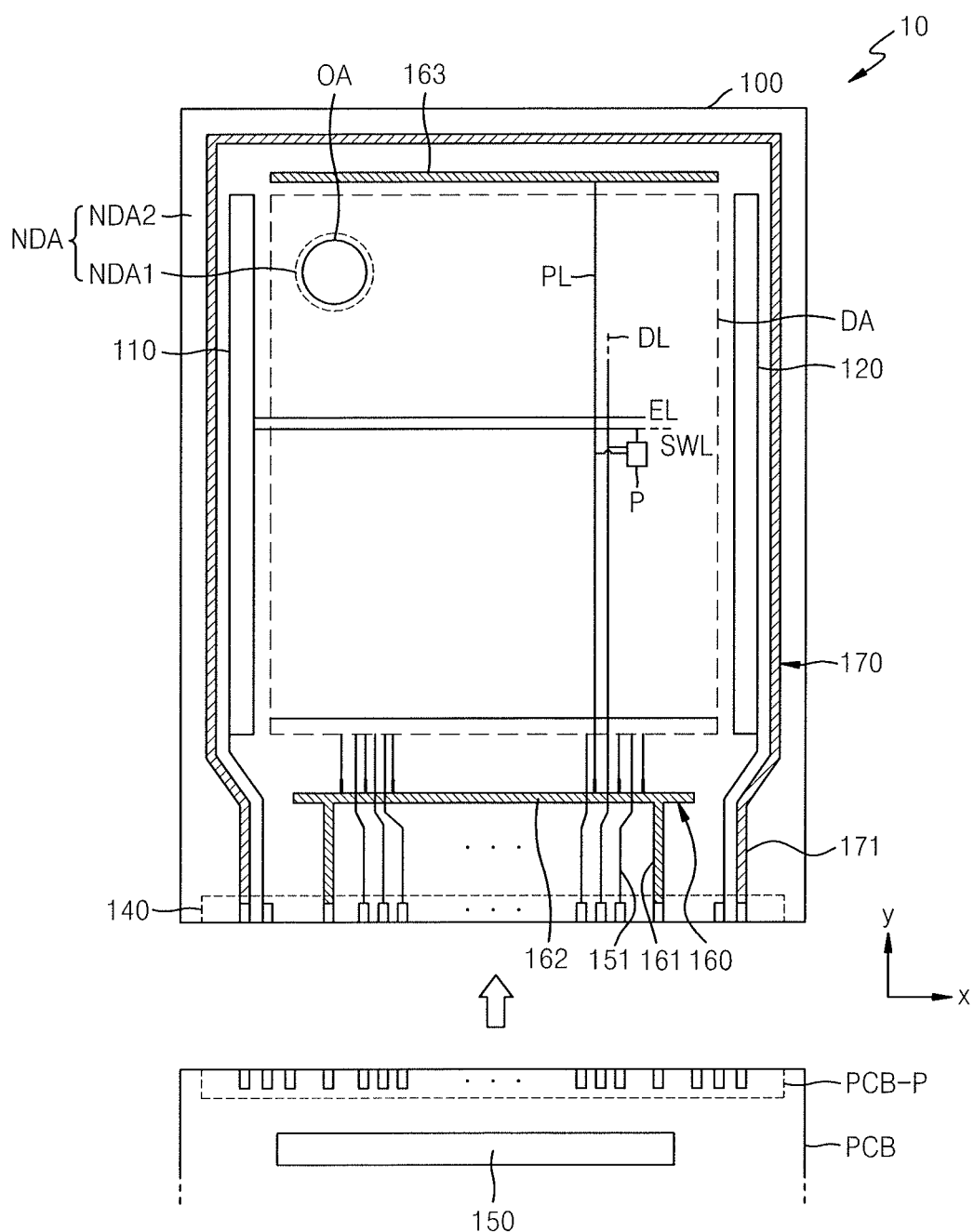
FIG. 5 illustrates a plan view of a display panel according to an embodiment.

FIG. 5 illustrates a plan view of the display panel 10 according to an embodiment.

Referring to FIG. 5, the display panel 10 may include the display area DA and the first and second non-display areas NDA1 and NDA2. FIG. 3 may be understood as a figure of the substrate 100 in the display panel 10. For example, the substrate 100 may be understood to have the opening area OA, the first and second non-display areas NDA1 and NDA2.

The display panel 10 may include a plurality of pixels P arranged in or on the display area DA. Each of the pixels P may include a display element such as an organic light-emitting diode. Each pixel P may emit, e.g., red, green, blue, or white light through the organic light-emitting diode. In the present specification, as described above, a pixel P may be understood as a pixel that emits red, green, blue, or white light. The opening area OA is arranged inside the display area DA, and the first non-display area NDA1 is located between the opening area OA and the display area DA.

The first non-display area NDA1 may surround the opening area OA. The first non-display area NDA1 may be an area in which a display element such as an organic light-emitting diode is not arranged. Signal lines and/or power lines that provide a signal to pixels P provided around the opening area OA may pass across the first non-display area NDA1.

Each pixel P may be electrically connected to outer circuits arranged in the second non-display area NDA2 surrounding the display area DA. A first outer driving circuit 110, a second outer driving circuit 120, a terminal 140, a data driving circuit 150, a first power supply line 160, and a second power supply line 170 may be arranged in the second non-display area NDA2.

The first outer driving circuit 110 may include a scan driving circuit and a control driving circuit and may provide a scan signal and an emission control signal to each pixel P through a scan line SWL and an emission control line EL. The second outer driving circuit 120 may also include a scan driving circuit and a control driving circuit and may be arranged side by side with the first outer driving circuit 110. Like the first outer driving circuit 110, the second outer driving circuit 120 may provide a scan signal and an emission control signal to each pixel P through the scan line SWL and the emission control line EL.

A terminal 140 may be arranged on one side of the second non-display area NDA2. The terminal 140 may not be covered by an insulating layer and may be exposed and electrically connected to a printed circuit board PCB. A terminal PCB-P of the printed circuit board PCB may be electrically connected to the terminal 140 of the display panel 10. The printed circuit board PCB transfers a signal of a controller or power to the display panel 10. Control signals generated by the controller may be respectively transferred to the first and second outer driving circuits 110 and 120 through the printed circuit board PCB. The controller may respectively provide first and second powers ELVDD and ELVSS (see FIG. 6 below) to the first and second power supply lines 160 and 170 through first and second connection wirings 161 and 171. The first power ELVDD may be provided to each pixel P through a driving voltage line PL connected to the first power supply line 160, and the second power ELVSS (also referred to as a common voltage) may be provided to an opposite electrode of a pixel P connected to the second power supply line 170.

The data driving circuit 150 may be electrically connected to the data line DL. A data signal of the data driving circuit 150 may be provided to each pixel P through a connection wiring 151 connected to the terminal 140 and the data line DL connected to the connection wiring 151. Though it is shown in FIG. 5 that the data driving circuit 150 is arranged on the printed circuit board PCB, the data driving circuit 150 may be arranged over the substrate 100 in another embodiment. For example, the data driving circuit 150 may be arranged between the terminal 140 and the first power supply line 160.

The first power supply line 160 may include a first sub line 162 and a second sub line 163 extending side by side in an x-direction with the display area DA therebetween. The second power supply line 170 may partially surround the display area DA in a loop shape whose one side is open.

Figure 6:
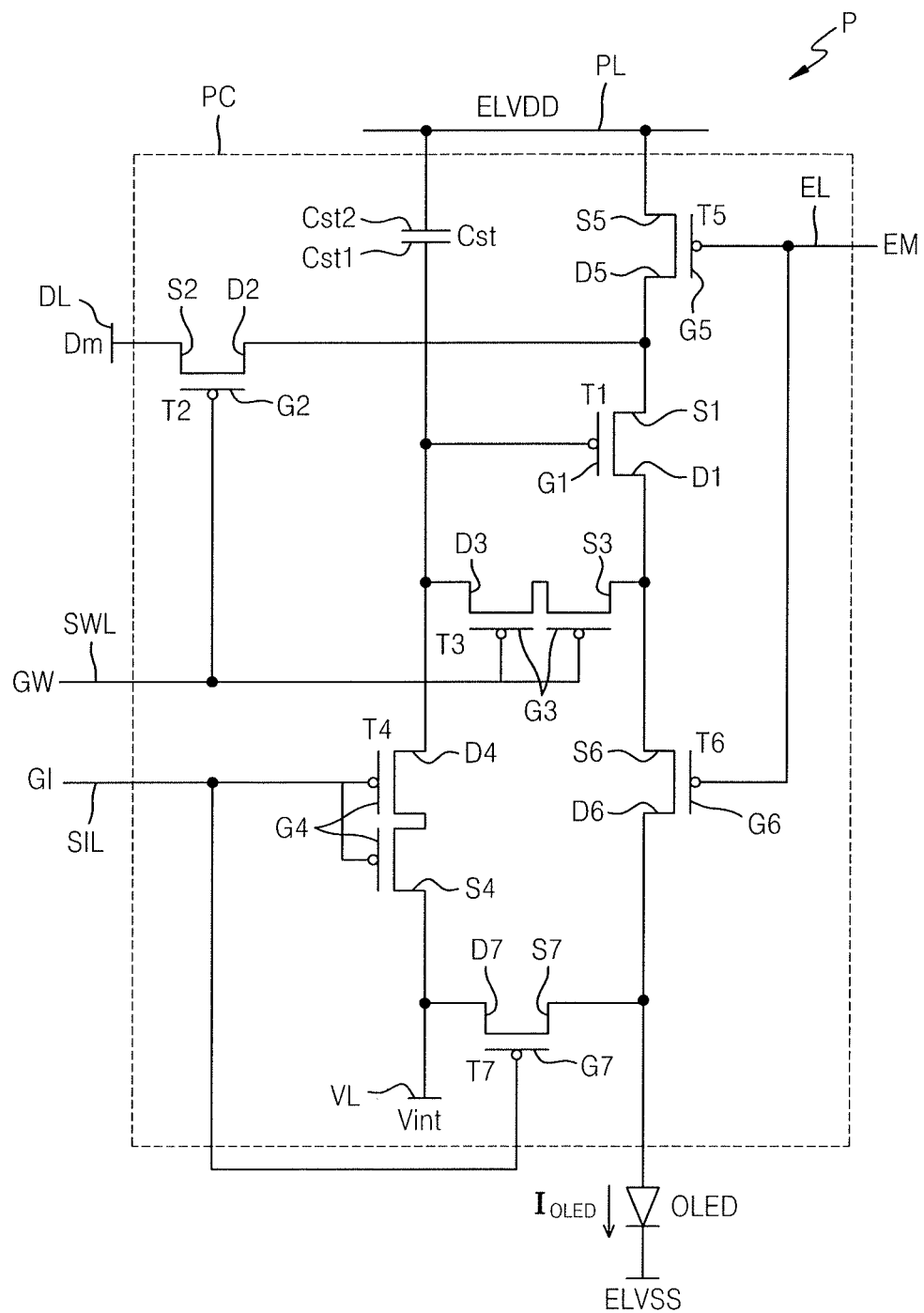
FIG. 6 illustrates an equivalent circuit diagram of one of pixels of a display panel according to an embodiment.

FIG. 6 illustrates an equivalent circuit diagram of one of pixels of the display panel 10 according to an embodiment.

Referring to FIG. 6, a pixel P includes the pixel circuit PC and an organic light-emitting diode OLED connected to the pixel circuit PC. The pixel circuit PC may include a plurality of thin film transistors and a storage capacitor. The thin film transistors and the storage capacitor may be connected to signal lines SWL, SIL, EL, and DL, an initialization voltage line VL, and the driving voltage line PL.

In an implementation, as illustrated in FIG. 6, each pixel P may be connected to the signal lines SWL, SIL, EL, and DL, the initialization voltage line VL, and the driving voltage line PL. In an implementation, at least one of the signal lines SWL, SIL, EL, and DL, the initialization voltage line VL, and the driving voltage line PL may be shared by neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines may include the scan line (N-th scan line) SWL configured to transfer a scan signal GW, a previous scan line ((N−1)th scan line) SIL configured to transfer a previous scan signal GI to the first initialization thin film transistor T4 and the second initialization thin film transistor T7, an emission control line EL configured to transfer an emission control signal EM to the operation control thin film transistor T5 and the emission control thin film transistor T6, and the data line DL intersecting with the scan line SWL and configured to transfer a data signal Dm. The driving voltage line PL transfers the driving voltage ELVDD to the driving thin film transistor T1, and the initialization voltage line VL transfers an initialization voltage Vint that initializes the driving thin film transistor T1 and a pixel electrode.

A driving gate electrode G1 of the driving thin film transistor T1 is connected to a first storage capacitor plate Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected with the pixel electrode of a light-emitting diode OLED through the emission control thin film transistor T6. The driving thin film transistor T1 receives a data signal Dm and supplies a driving current $I_{OLED}$ to the organic light-emitting diode OLED in response to a switching operation of the switching thin film transistor T2.

A switching gate electrode G2 of the switching thin film transistor T2 is connected to the scan line SWL, a switching source electrode S2 of the switching thin film transistor T2 is connected to the data line DL, and a switching drain electrode D2 of the switching thin film transistor T2 is connected to the driving source electrode S1 of the driving thin film transistor T1 and connected to the driving voltage line PL through the operation control thin film transistor T5. The switching thin film transistor T2 is turned on response to a scan signal GW transferred through the scan line SWL and performs a switching operation of transferring a data signal Dm transferred through the data line DL to the driving source electrode S1 of the driving thin film transistor T1.

A compensation gate electrode G3 of the compensation thin film transistor T3 is connected to the scan line SWL, a compensation source electrode S3 of the compensation thin film transistor T3 is connected to the driving drain electrode D1 of the driving thin film transistor T1 and connected to the pixel electrode of the organic light-emitting diode OLED through the emission control thin film transistor T6, and a compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal GW transferred through the scan line SWL and diode-connects the driving thin film transistor T1 by electrically connecting the driving gate electrode G1 with the driving drain electrode D1 of the driving thin film transistor T1.

A first initialization gate electrode G4 of the first initialization thin film transistor T4 is connected to the previous scan line SIL, a first initialization source electrode S4 of the first initialization thin film transistor T4 is connected to a second initialization drain electrode D7 of the second initialization thin film transistor T7 and the initialization voltage line VL, and a first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal GI transferred through the previous scan line SIL and performs an initialization operation of initializing a voltage of the driving gate electrode G1 of the driving thin film transistor T1 by transferring the initialization voltage Vint to the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to a second initialization source electrode S7 of the second initialization thin film transistor T7 and the pixel electrode of the organic light-emitting diode OLED.

The operation control thin film transistor T5 and the emission control thin film transistor T6 are simultaneously turned on in response to an emission control signal EM transferred through the emission control line EL to allow the driving voltage ELVDD to be transferred to the organic light-emitting diode OLED and allow the driving current $I_{OLED}$ to flow through the organic light-emitting diode OLED.

A second initialization gate electrode G7 of the second initialization thin film transistor T7 is connected to the previous scan line SIL, a second initialization source electrode S7 of the second initialization thin film transistor T7 is connected to the emission control drain electrode D6 of the emission control thin film transistor T6 and the pixel electrode of the organic light-emitting diode OLED, and a second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal GI transferred through the previous scan line SIL to initialize the pixel electrode of the organic light-emitting diode OLED.

In an implementation, as shown in FIG. 6, the first initialization thin film transistor T4 and the second initialization thin film transistor T7 may be connected to the previous scan line SIL. In an implementation, the first initialization thin film transistor T4 may be connected to the previous scan line SIL and driven in response to a previous scan signal GI, and the second initialization thin film transistor T7 may be connected to a separate signal line (e.g. the next scan line or (N+1)th scan line) and driven in response to a signal transferred through the signal line.

A second storage capacitor plate Cst2 of the storage capacitor Cst is connected to the driving voltage line PL, and the opposite electrode of the organic light-emitting diode OLED is connected to a common voltage ELVSS. Accordingly, the organic light-emitting diode OLED may display an image by receiving the driving current $I_{OLED}$ from the driving thin film transistor T1 and emitting light.

In an implementation, as shown in FIG. 6, each of the compensation thin film transistor T3 and the initialization thin film transistor T4 may include a dual gate electrode. In an implementation, each of the compensation thin film transistor T3 and the initialization thin film transistor T4 may include one gate electrode.

In an implementation, as shown FIG. 6, the pixel circuit PC may include seven thin film transistors and one storage capacitor. In an implementation, the number of thin film transistors and the number of storage capacitors may be six or less or eight or less and may be variously modified depending on a design. Hereinafter, for convenience of description, description is made based on the pixel circuit PC shown in FIG. 6.

Figure 7A:
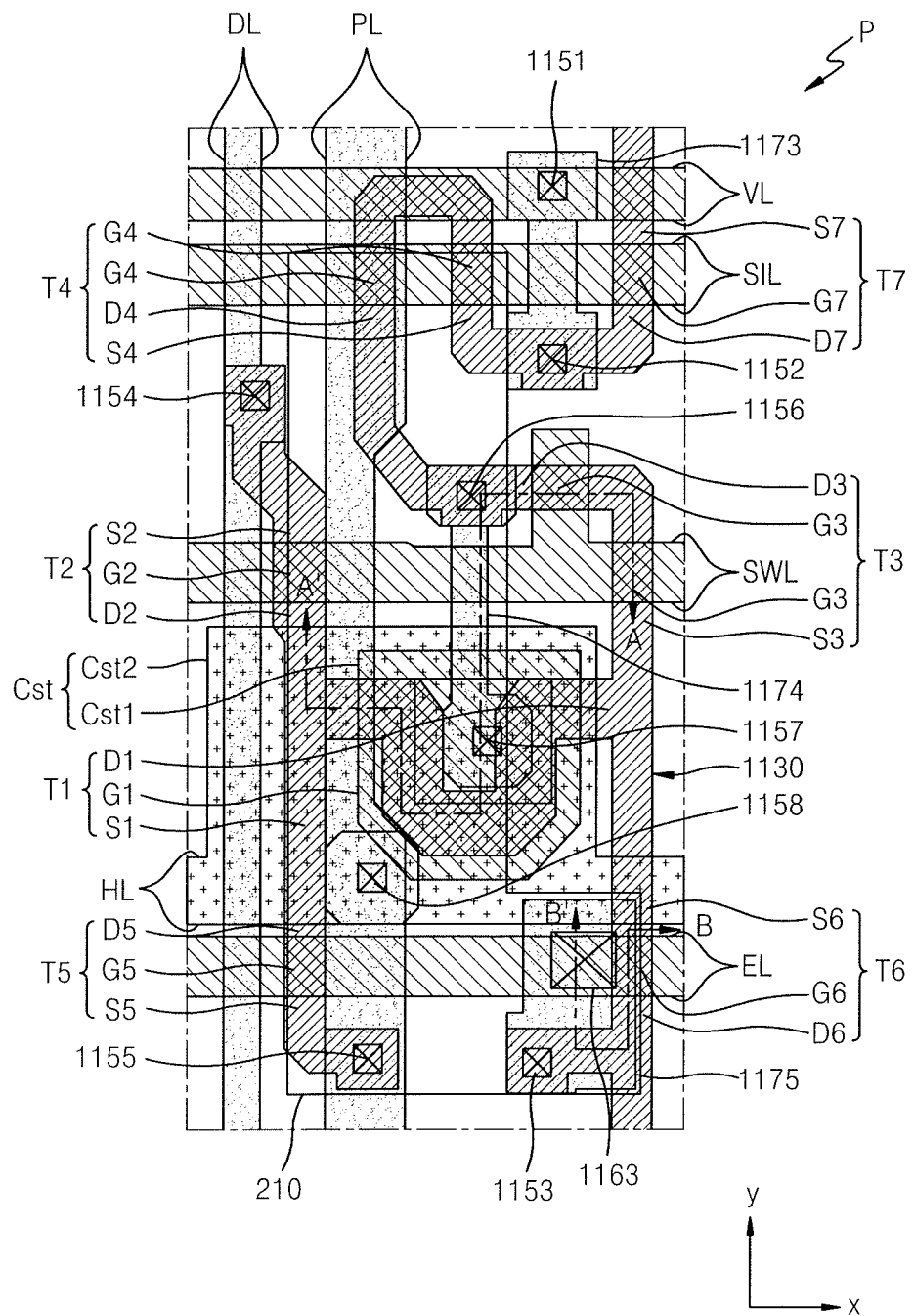
FIG. 7A illustrates a plan view of a pixel of a display panel according to an embodiment.
Figure 7B:
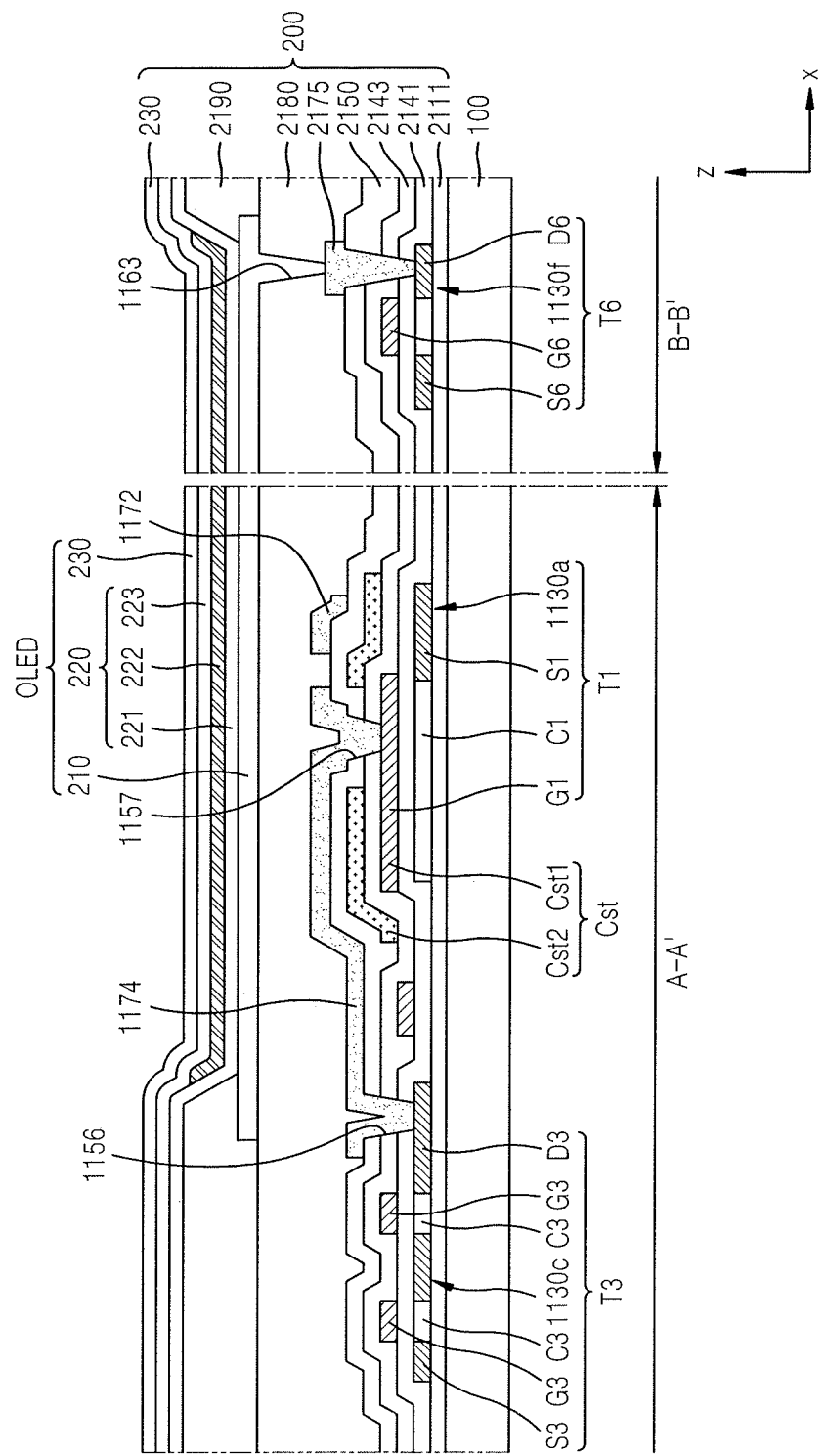
FIG. 7B illustrates a cross-sectional view taken along lines A-A' and B-B' of FIG. 7A.

FIG. 7A illustrates a plan view of one of pixels of the display panel 10 according to an embodiment, and FIG. 7B illustrates a cross-sectional view taken along lines A-A' and B-B' of FIG. 7A.

Referring to FIGS. 7A and 7B, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along a semiconductor layer 1130. As shown in FIG. 7B, the semiconductor layer 1130 is located over the substrate 100, and a buffer layer 2111 including an inorganic material such as silicon oxide, silicon nitride, and silicon oxynitride is formed under the semiconductor layer 1130.

Some areas of the semiconductor layer 1130 correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. For example, it may be understood that the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are connected to each other and bent in various shapes. FIG. 7B shows a driving semiconductor layer 1130a of the driving thin film transistor T1, a compensation semiconductor layer 1130c of the compensation thin film transistor T3, and an emission control semiconductor layer 1130f of the emission control thin film transistor T6 respectively corresponding to some areas of the semiconductor layer 1130.

The semiconductor layer 1130 may include a channel region, and a source region and a drain region respectively on two opposite sides of the channel region. The source region and the drain region may be understood as a source electrode and a drain electrode of a relevant thin film transistor. Hereinafter, for convenience of description, the source region and the drain region are respectively referred to as the source electrode and the drain electrode.

The driving thin film transistor T1 may include the driving gate electrode G1 overlapping a driving channel region and the driving source electrode S1 and the driving drain electrode D1 respectively on two opposite sides of the driving channel region. The driving channel region overlapping the driving gate electrode G1 may form a long channel length inside a narrow space by having a bent shape such as an omega shape. In the case where the length of the driving channel region is long, a driving range of a gate voltage is widened and thus a gray scale of light emitted from an organic light-emitting diode OLED may be more elaborately controlled and thus a display quality may be improved.

The switching thin film transistor T2 may include the switching gate electrode G2 overlapping a switching channel region and the switching source electrode S2 and the switching drain electrode D2 respectively on two opposite sides of the switching channel region. The switching drain electrode D2 may be connected to the driving source electrode S1.

The compensation thin film transistor T3 may be a dual thin film transistor and may include the compensation gate electrodes G3 overlapping two compensation channel regions and include the compensation source electrode S3 and the compensation drain electrode D3 respectively on two opposite sides of the compensation channel region. The compensation thin film transistor T3 may be connected to the driving gate electrode G1 of the driving thin film transistor T1 through a node connection line 1174 which will be described below.

The first initialization thin film transistor T4 may be a dual thin film transistor and may include the first initialization gate electrodes G4 overlapping two first initialization channel regions and include the first initialization source electrode S4 and the first initialization drain electrode D4 respectively on two opposite sides of the first initialization channel region.

The operation control thin film transistor T5 may include the operation control gate electrode G5 overlapping an operation control channel region and the operation control source electrode S5 and the operation control drain electrode D5 respectively on two opposite sides of the operation control channel region. The operation control drain electrode D5 may be connected to the driving source electrode S1.

The emission control thin film transistor T6 may include the emission control gate electrode G6 overlapping an emission control channel region and the source electrode S6 and the emission control drain electrode D6 respectively on two opposite sides of the emission control channel region. The emission control source electrode S6 may be connected to the driving drain electrode D1.

The second initialization thin film transistor T7 may include the second initialization gate electrode G7 overlapping a second initialization channel region and the second initialization source electrode S7 and the second initialization drain electrode D7 respectively on two opposite sides of the second initialization channel region.

The above-described thin film transistors may be connected to the signal lines SWL, SIL, EL, and DL, the initialization voltage line VL, and the driving voltage line PL.

A gate insulating layer 2141 (see FIG. 7B) may be arranged on the semiconductor layer 1130. The scan line SWL, the previous scan line SIL, the emission control line EL, the driving gate electrode G1, and the initialization voltage line VL may be arranged on the gate insulating layer 2141. The gate insulating layer 2141 may include an inorganic material such as silicon oxide, silicon nitride, and silicon oxynitride. The scan line SWL, the previous scan line SIL, the emission control line EL, the driving gate electrode G1, and the initialization voltage line VL may include metal such as Mo, Al, Cu, Ti, and an alloy thereof.

The scan line SWL may extend in the x-direction. Some regions or portions of the scan line SWL may respectively correspond to the switching and compensation gate electrodes G2 and G3. For example, regions or portions of the scan line SWL that overlap the channel regions of the switching and compensation thin film transistors T2 and T3 may be the switching and compensation gate electrodes G2 and G3, respectively.

The previous scan line SIL may extend in the x-direction. Some regions or portions of the previous scan line SIL may respectively correspond to the first and second initialization gate electrodes G4 and G7. For example, regions or portions of the previous scan line SIL that overlap the channel regions respectively of the first and second initialization thin film transistors T4 and T7 may be the first and second initialization gate electrodes G4 and G7, respectively.

The emission control line EL may extend in the x-direction. Some regions or portions of the emission control line EL may respectively correspond to the operation control and emission control gate electrodes G5 and G6. For example, regions or portions of the emission control line EL that overlap the channel regions respectively of the operation control and emission control thin film transistors T5 and T6 may be the operation control and emission control gate electrodes G5 and G6, respectively.

The driving gate electrode G1 is an island electrode and may be connected to the compensation thin film transistor T3 through the node connection line 1174.

The initialization voltage line VL may extend in the x-direction. The initialization voltage line VL may be connected to the first and second initialization thin film transistors T4 and T7 through an initialization connection line 1173 which will be described below.

In an implementation, as illustrated in FIG. 7A, the initialization voltage line VL may be arranged on the gate insulating layer 2141. In an implementation, the initialization voltage line VL may be arranged on a planarization insulating layer 2180 (see FIG. 7B) which will be described below and may include the same material as that of the pixel electrode 210 in another embodiment. In an implementation, the initialization voltage line VL may be arranged on a first interlayer insulating layer 2143. The initialization voltage line VL may include the same material as that of the second storage capacitor plate Cst2.

An electrode voltage line HL may be arranged over the scan line SWL, the previous scan line SIL, the emission control line EL, the driving gate electrode G1, and the initialization voltage line VL with the first interlayer insulating layer 2143 (see FIG. 7B) including an inorganic material therebetween.

As shown in FIG. 7A, the electrode voltage line HL may extend in the x-direction to intersect with the data line DL and the driving voltage line PL. A portion of the electrode voltage line HL may cover at least a portion of the driving gate electrode G1 and may constitute the storage capacitor Cst in cooperation with the driving gate electrode G1. For example, the driving gate electrode G1 may serve as the first storage capacitor plate Cst1 of the storage capacitor Cst, and a portion of the electrode voltage line HL may serve as the second storage capacitor plate Cst2 of the storage capacitor Cst.

The driving voltage line PL and the second storage capacitor plate Cst2 are electrically connected to each other. With regard to this, it is shown in FIG. 7A that the electrode voltage line HL is connected to the driving voltage line PL arranged on the electrode voltage line HL through a contact hole 1158. The electrode voltage line HL may have the same voltage level (a constant voltage, e.g. +5V) as that of the driving voltage line PL. The electrode voltage line HL may be understood as a kind of a transverse direction driving voltage line.

The driving voltage line PL may extend in a y-direction and the electrode voltage line HL electrically connected to the driving voltage line PL may extend in the x-direction that intersects with the y-direction, and a plurality of driving voltage lines PL and a plurality of electrode voltage lines HL may constitute a mesh structure in the display area DA.

The data line DL, the driving voltage line PL, the initialization connection line 1173, and the node connection line 1174 may be arranged on the second storage capacitor plate Cst2 and the electrode voltage line HL with a second interlayer insulating layer 2150 (see FIG. 7B) including an inorganic material therebetween. The data line DL, the driving voltage line PL, the initialization connection line 1173, and the node connection line 1174 may include at least one of Al, Cu, and Ti and may include a single layer or a multi-layer. In an implementation, the driving voltage line PL and the data line DL may have a multi-layered structure including Ti/Al/Ti.

The data line DL may extend in the y-direction and may be connected to the switching source electrode S2 of the switching thin film transistor T2 through a contact hole 1154. A portion of the data line DL may be understood as the switching source electrode S2.

The driving voltage line PL may extend in the y-direction and may be connected to the electrode voltage line HL through a contact hole 1158. Also, the driving voltage line PL may be connected to the operation control thin film transistor T5 through a contact hole 1155. The driving voltage line PL may be connected to the operation control drain electrode D5 through a contact hole 1155.

One end of the initialization connection line 1173 may be connected to the first and second initialization thin film transistors T4 and T7 through a contact hole 1152, and the other end of the initialization connection line 1173 may be connected to the initialization voltage line VL through a contact hole 1151.

One end of the node connection line 1174 may be connected to the compensation drain electrode D3 through a contact hole 1156, and the other end of the node connection line 1174 may be connected to the driving gate electrode G1 through a contact hole 1157.

The planarization insulating layer 2180 including an organic insulating material is located on the data line DL, the driving voltage line PL, the initialization connection line 1173, and the node connection line 1174. The pixel electrode 210 is arranged on the planarization insulating layer 2180.

Referring to FIG. 7B, edges of the pixel electrode 210 may be covered by a pixel-defining layer 2190 on the planarization insulating layer 2180. A central region of the pixel electrode 210 may be exposed through an opening of the pixel-defining layer 2190. The pixel electrode 210 may include a reflective layer including Ag, Mg, Al, Pt, Pd, Au, Ni, Nd, Ir, Cr, or a compound thereof. In an implementation, the pixel electrode 210 may further include a layer including indium tin oxide (ITO), zinc oxide (IZO), zinc oxide (ZnO), indium oxide ($In_2O_3$) on and/or under the reflective layer. An intermediate layer 220 is arranged on a portion of the pixel electrode 210 exposed through the opening.

The intermediate layer 220 may include an emission layer 222 on a portion of the pixel electrode 210 exposed through the opening of the pixel-defining layer 2190. The emission layer 222 may include a polymer or low molecular organic material that emits light of a predetermined color. In an implementation, as shown in FIG. 7B, the intermediate layer 220 may include a first functional layer 221 under the emission layer 222 and/or a second functional layer 223 on the emission layer 222.

The first functional layer 221 may include a single layer or a multi-layer. For example, in the case where the first functional layer 221 includes a polymer material, the first functional layer 221 may include a hole transport layer (HTL), which has a single-layered structure, and may include poly-(3,4)-ethylene-dihydroxy thiophene (PEDOT) or polyaniline (PANI). In the case where the first functional layer 221 includes a low molecular material, the first functional layer 221 may include a hole injection layer (HIL) and an HTL.

In an implementation, the second functional layer 223 may be omitted. For example, in the case where the first functional layer 221 and the emission layer 222 include a polymer material, the second functional layer 223 may be provided to make a characteristic of the organic light-emitting diode OLED excellent. The second functional layer 223 may be a single layer or a multi-layer. The second functional layer 223 may include an electron transport layer (ETL) and/or an electron injection layer (EIL).

An opposite electrode 230 is arranged to face the pixel electrode 210 with the intermediate layer 220 therebetween. The opposite electrode 230 may include a conductive material having a low work function. For example, the opposite electrode 230 may include a (semi) transparent layer including Ag, Mg, Al, Pt, Pd, Au, Ni, Nd, Ir, Cr, Li, Ca, or an alloy thereof. In an implementation, the opposite electrode 230 may further include a layer including ITO, IZO, ZnO, or $In_2O_3$ on the (semi) transparent layer including the above-mentioned material.

In an implementation, the display element layer 200 arranged on the substrate 100, e.g., the layers from the buffer layer 2111 to the opposite electrode 230 may be covered by the encapsulation member described above with reference to FIGS. 3A to 4C.

Figure 8:
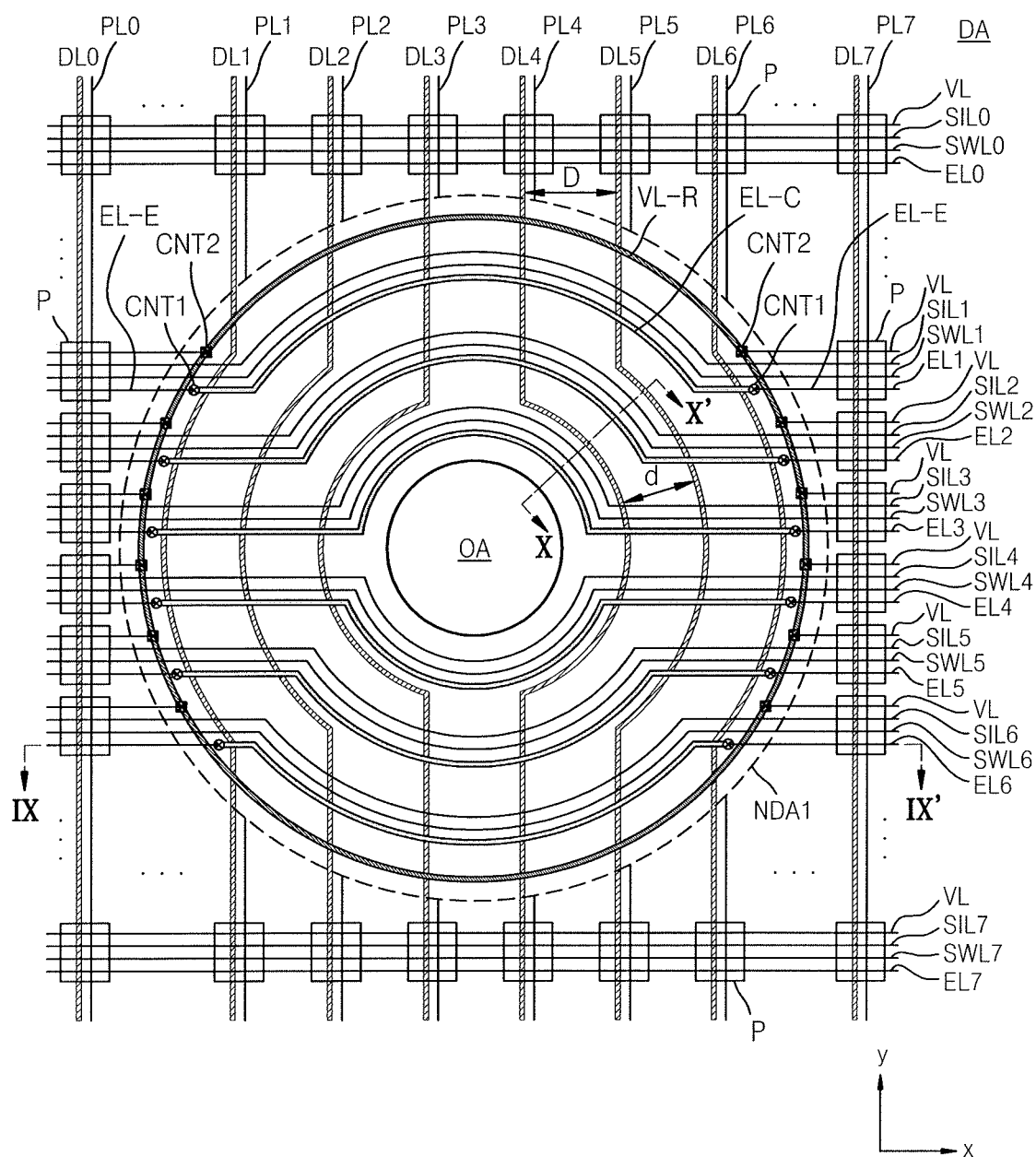
FIG. 8 illustrates a plan view of lines around an opening area in a display panel according to an embodiment.
Figure 9:
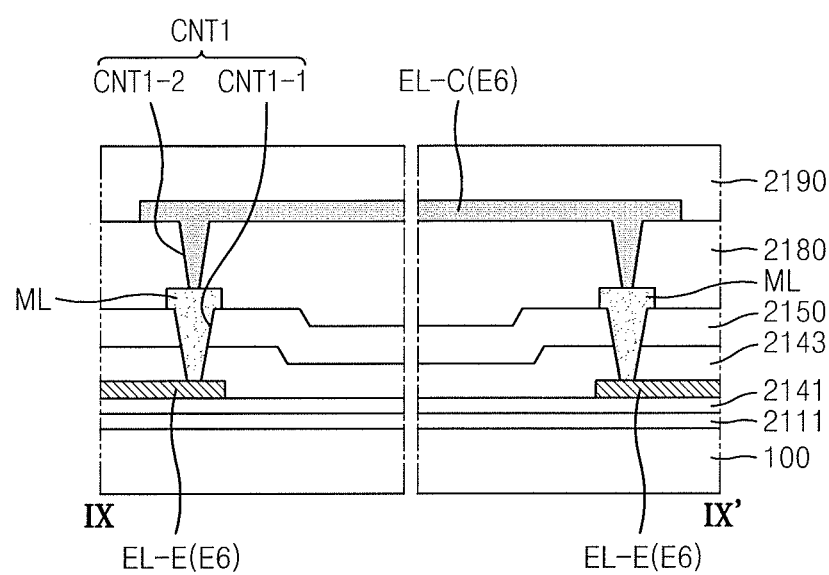
FIG. 9 illustrates a cross-sectional view taken along a line IX-IX' of FIG. 8.
Figure 10:
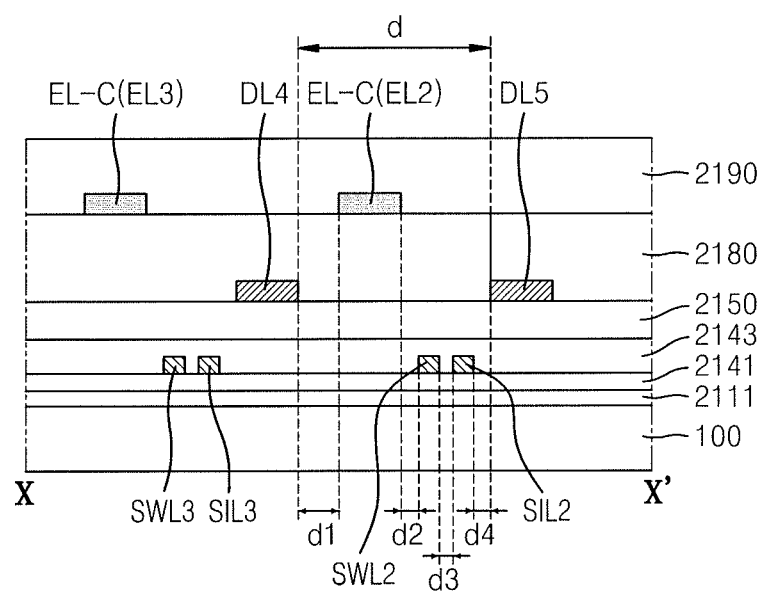
FIG. 10 illustrates a cross-sectional view taken along a line X-X' of FIG. 8.

FIG. 8 illustrates a plan view of lines around the opening area OA in the display panel 10 according to an embodiment, FIG. 9 illustrates a cross-sectional view taken along line IX-IX' of FIG. 8, and FIG. 10 illustrates a cross-sectional view taken along line X-X' of FIG. 8. In an implementation, as shown in FIG. 8, six pixels may be arranged each of up and down, and left and right of the opening area OA. In an implementation, a greater number of pixels and/or a greater number of lines may be arranged.

Referring to FIG. 8, data lines DL0, DL1, DL2, DL3, DL4, DL5, DL6, and DL7 and driving voltage lines PL0, PL1, PL2, PL3, PL4, PL5, PL6, and PL7 may extend in the y-direction. The driving voltage lines PL1, PL2, PL3, PL4, PL5, and PL6 among the driving voltage lines PL0, PL1, PL2, PL3, PL4, PL5, PL6, and PL7 in FIG. 8 may be disconnected with respect to the opening area OA. Portions of the driving voltage lines PL1, PL2, PL3, PL4, PL5, and PL6 that are located at upper side of the opening area OA may be connected to the second sub line 163 (see FIG. 5), and portions of the driving voltage lines PL1, PL2, PL3, PL4, PL5, and PL6 that are located at lower side of the opening area OA may be connected to the first sub line 162 (see FIG. 5).

Some of the data lines DL0, DL1, DL2, DL3, DL4, DL5, DL6, and DL7 that pass across the display area DA, e.g., the first to sixth data lines DL1, DL2, DL3, DL4, DL5, and DL6 may detour around an edge of the opening area OA in the first non-display area NDA1 For example, each of the first to sixth data lines DL1, DL2, DL3, DL4, DL5, and DL6 (connecting pixels P that are arranged on an upper and a lower side of the opening area OA in FIG. 8) may include a portion extending in the y-direction in the display area DA, and a portion that detours around the edge of the opening area OA in the first non-display area NDA1. In an implementation, as shown in FIG. 8, the detouring portion of the data line DL may have an arc-shaped curve. In an implementation, the detouring portion may be a line bent in zigzag. In an implementation, a detouring portion of each of the other lines may have an arc-shaped curve or the detouring portion may be a line bent in zigzag.

In FIG. 8, the pixels P located on an upper side and a lower side of the opening area OA may be electrically connected to the first to sixth data lines DL1, DL2, DL3, DL4, DL5, and DL6 that detour around the opening area OA and may receive a data signal through the connected data line. The first to third data lines DL1, DL2, and DL3 among the first to sixth data lines DL1, DL2, DL3, DL4, DL5, and DL6 may detour around the opening area OA on a first side (e.g. a left side) of the opening area OA, and the fourth to sixth data lines DL4, DL5, and DL6 may detour around the opening area OA on a second side (e.g. a right side) of the opening area OA.

Scan lines SWL0, SWL1, SWL2, SWL3, SWL4, SWL5, SWL6, and SWL7 and previous scan lines SIL0, SIL1 SIL2, SIL3, SIL4, SIL5, SIL6, and SIL7 may extend in the x-direction that intersect with the y-direction. Some of the scan lines SWL0, SWL1, SWL2, SWL3, SWL4, SWL5, SWL6, and SWL7, e.g., the first to sixth scan lines SWL1, SWL2, SWL3, SWL4, SWL5, and SWL6 and some of the previous scan lines SIL0, SIL1 SIL2, SIL3, SIL4, SIL5, SIL6, and SIL7, e.g., the first to sixth previous scan lines SIL1 SIL2, SIL3, SIL4, SIL5, and SIL6 may detour around the opening area OA. For example, the first to third scan lines SWL1, SWL2, and SWL3 and the first to third previous scan lines SIL1 SIL2, and SIL3 may detour around the opening area OA on a third side (e.g. an upper side) of the opening area OA, and the fourth to sixth scan lines SWL4, SWL5, and SWL6 and the fourth to sixth previous scan lines SIL4, SIL5, and SIL6 may detour around the opening area OA on a fourth side (e.g. a lower side) of the opening area OA.

The first to sixth scan lines SWL1, SWL2, SWL3, SWL4, SWL5, and SWL6 and the first to sixth previous scan lines SIL1 SIL2, SIL3, SIL4, SIL5, and SIL6 may be on the gate insulating layer 2141 in the display area DA as described with reference to FIGS. 7A and 7B, and may detour around the opening area OA while being located on the gate insulating layer even in the first non-display area NDA1.

Emission control lines EL0, EL1, EL2, EL3, EL4, EL5, EL6, and EL7 may extend in the x-direction. Some of the emission control lines EL0, EL1, EL2, EL3, EL4, EL5, EL6, and EL7, e.g., the first to sixth emission control lines EL1, EL2, EL3, EL4, EL5, and EL6 may detour around the opening area OA. For example, the first to third emission control lines EL1, EL2, and EL3 may detour around the opening area OA on an upper side of the opening area OA, and the fourth to sixth emission control lines EL4, EL5, and EL6 may detour around the opening area OA on a lower side of the opening area OA.

Each of the first to sixth emission control lines EL1, EL2, EL3, EL4, EL5, and EL6 includes an extension portion EL-E in the display area DA and a detouring portion EL-C in the first non-display area NDA1. The extension portion EL-E and the detouring portion EL-C may be respectively located on different layers (e.g., different distances from the substrate 100). Referring to FIG. 9, the extension portion EL-E of the sixth emission control line EL6 may be on (e.g., directly on) the gate insulating layer 2141, and the detouring portion EL-C of the sixth emission control line EL6 may be on (e.g., directly on) the planarization insulating layer 2180. The extension portion EL-E and the detouring portion EL-C of the sixth emission control line EL6 may be electrically connected to each other through a first contact hole CNT1, and mediation metals ML may be located therebetween. In an implementation, the extension portion EL-E of the sixth emission control line EL6 may be on (e.g., directly on) the first interlayer insulating layers 2143.

The mediation metals ML may be on the second interlayer insulating layer 2150. The mediation metals ML may be respectively connected to the extension portions EL-E through a (1-1)st contact hole CNT1-1 of the first and second interlayer insulating layers 2143 and 2150, and the detouring portions EL-C may be respectively connected to the mediation metals ML through a (1-2)nd contact hole CNT1-2. The mediation metals ML may include island metals arranged in only an area corresponding to the first contact hole CNT1 and include the same material as that of the data line. The detouring portion EL-C on the planarization insulating layer 2180 may include the same material as that of the pixel electrode 210 described with reference to FIG. 7B. Like the structure of the sixth emission control line EL6 shown in FIG. 9, each of the first to fifth emission control lines EL1, EL2, EL3, EL4, and EL5 may include the extension portion EL-E and the detouring portion EL-C respectively arranged in different layers.

An interval between neighboring data lines in the first non-display area NDA1, e.g., an interval d between detouring portions of the neighboring data lines may be less than an interval D (see FIG. 8) between the neighboring data lines in the display area DA. A display quality of some pixels in the display area DA could be deteriorated by coupling caused between detouring portions of data lines arranged to have the relatively narrow interval d. In contrast, according to an embodiment, the detouring portion EL-C may be arranged between the neighboring data lines in the first non-display area NDA1, an issue due to the occurrence of the above-mentioned coupling may be minimized.

In the first non-display area NDA1, the detouring portions of the first to sixth scan lines SWL1, SWL2, SWL3, SWL4, SWL5, and SWL6 and the first to sixth previous scan lines SIL1 SIL2, SIL3, SIL4, SIL5, and SIL6 may be on a layer different from a layer on which the detouring portions EL-C of the first to sixth emission control lines EL1, EL2, EL3, EL4, EL5, and EL6 are arranged. Meanwhile, in the first non-display area NDA1, the detouring portions of the first to sixth scan lines SWL1, SWL2, SWL3, SWL4, SWL5, and SWL6 and the first to sixth previous scan lines SIL1 SIL2, SIL3, SIL4, SIL5, and SIL6 may be spaced from each other while not overlapping the detouring portions EL-C of the first to sixth emission control lines EL1, EL2, EL3, EL4, EL5, and EL6.

For example, as shown in FIG. 10, the detouring portion EL-C of the second emission control line EL2 between the fourth and fifth data lines DL4 and DL5 that neighbor each other, the second scan line SWL2, and the second previous scan line SIL2 may be spaced apart from one other. For example, when the display panel 10 is viewed from a direction perpendicular to a top surface of the substrate 100, the fourth data line DL4 may be (e.g., laterally) spaced apart from the detouring portion EL-C of the second emission control line EL2 by a first interval d1, the detouring portion EL-C of the second emission control line EL2 may be spaced apart from the second scan line SWL2 by a second interval d2, the second scan line SWL2 may be spaced apart from the second previous scan line SIL2 by a third interval d3, and the second previous scan line SIL2 may be spaced apart from the fifth data line DL5 by a fourth interval d4.

As shown in FIG. 8, the initialization voltage line VL of each pixel P may extend in the x-direction in the display area DA, and the initialization voltage line VL that transfers an initialization voltage to a pixel arranged in left and right of the opening area OA may be disconnected around the opening area OA. The initialization voltage lines VL that are disconnected around the opening area OA may be connected to an electrode layer VL-R arranged in the first non-display area NDA1 through a second contact hole CNT2. The electrode layer VL-R may have a ring shape surrounding the opening area OA.

As described above with reference to FIGS. 7A and 7B, the initialization voltage line VL may be arranged on the first interlayer insulating layer 2143, and the electrode layer VL-R may be arranged on the planarization insulating layer 2180. The electrode layer VL-R may be connected to the initialization voltage lines VL through the second contact hole CNT2.

Figure 11:
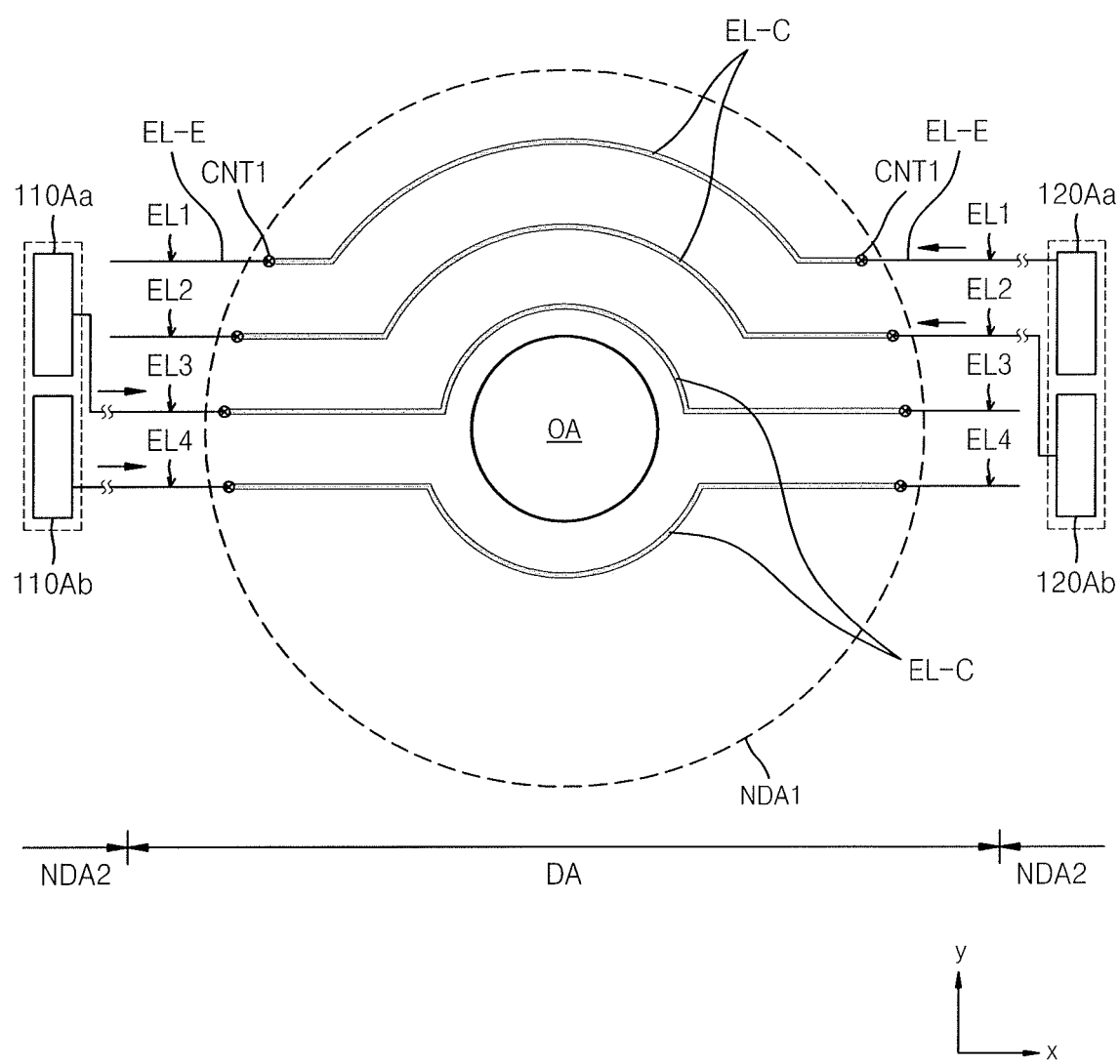
FIG. 11 illustrates a plan view of an emission control line and an emission control driver in a display panel according to an embodiment.

FIG. 11 illustrates the display panel 10 according to an embodiment. The first to fourth emission control lines EL1, EL2, EL3, and EL4 of FIG. 11 correspond to the first to fourth emission control lines described above with reference to FIGS. 8 to 10.

The first emission control line EL1 may receive an emission control signal from a first emission control driver 120Aa located in the second non-display area NDA2 on the right of FIG. 11, and a relevant signal may be provided to pixels respectively arranged on left and right sides of the opening area OA through the extension portion EL-E, the detouring portion EL-C, and the other extension portion EL-E of the first emission control line EL1. Likewise, the second emission control line EL2 may receive an emission control signal from a second emission control driver 120Ab located in the second non-display area NDA2 on the right of FIG. 11, and a relevant signal may be provided to pixels respectively arranged on left and right sides of the opening area OA through the extension portion EL-E, the detouring portion EL-C, and the other extension portion EL-E of the second emission control line EL2.

The third emission control line EL3 may receive an emission control signal from a third emission control driver 110Aa in the second non-display area NDA2 on the left of FIG. 11, and a relevant signal may be provided to pixels respectively arranged on left and right sides of the opening area OA through the extension portion EL-E, the detouring portion EL-C, and the other extension portion EL-E of the third emission control line EL3. Likewise, the fourth emission control line EL4 may receive an emission control signal from a fourth emission control driver 110Ab in the second non-display area NDA2 on the left of FIG. 11, and a relevant signal may be provided to pixels respectively arranged on left and right sides of the opening area OA through the extension portion EL-E, the detouring portion EL-C, and the other extension portion EL-E of the fourth emission control line EL4.

In some other devices, if the first emission control lines EL1 are spaced apart from each other around the opening area OA while not including the detouring portion EL-C, e.g., the first emission control lines EL1 include only the extension portions EL-E, a pair of first emission control drivers 120Aa respectively located in the second non-display areas NDA2 on the left and right of the display area DA are required. Likewise, in the case where the second to fourth emission control lines EL2, EL3, and EL4 are spaced apart from each other around the opening area OA while not including the detouring portion EL-C, pairs of second to fourth emission control drivers 120Ab, 110Aa, and 110Ab respectively located in the second non-display areas NDA2 on the left and right of the display area DA are required. In this case, an area of the second non-display area NDA2 may increase.

In contrast, according to an embodiment, as shown in FIG. 11, each of the first to fourth emission control lines EL1, EL2, EL3, and EL4 may include the detouring portion EL-C connected to the extension portions EL-E, the number of emission control drivers arranged in the second non-display area NDA2 of FIG. 11 and an area of the emission control drivers may be reduced.

In an implementation, as illustrated in FIG. 11, the first to fourth emission control drivers 120Aa, 120Ab, 110Aa, and 110Ab may be alternately arranged in pairs on the left and right around the display area DA. In an implementation, the first to fourth emission control drivers 120Aa, 120Ab, 110Aa, and 110Ab may be alternately arranged in the second non-display areas NDA2 respectively located on the left and right around the display area DA. For example, the first and third emission control drivers 120Aa and 110Aa may be arranged in the second non-display areas NDA2 located on the right of the display area DA, and the second and fourth emission control drivers 120Ab and 110Ab may be arranged in the second non-display areas NDA2 located on the left of the display area DA.

Figure 12:
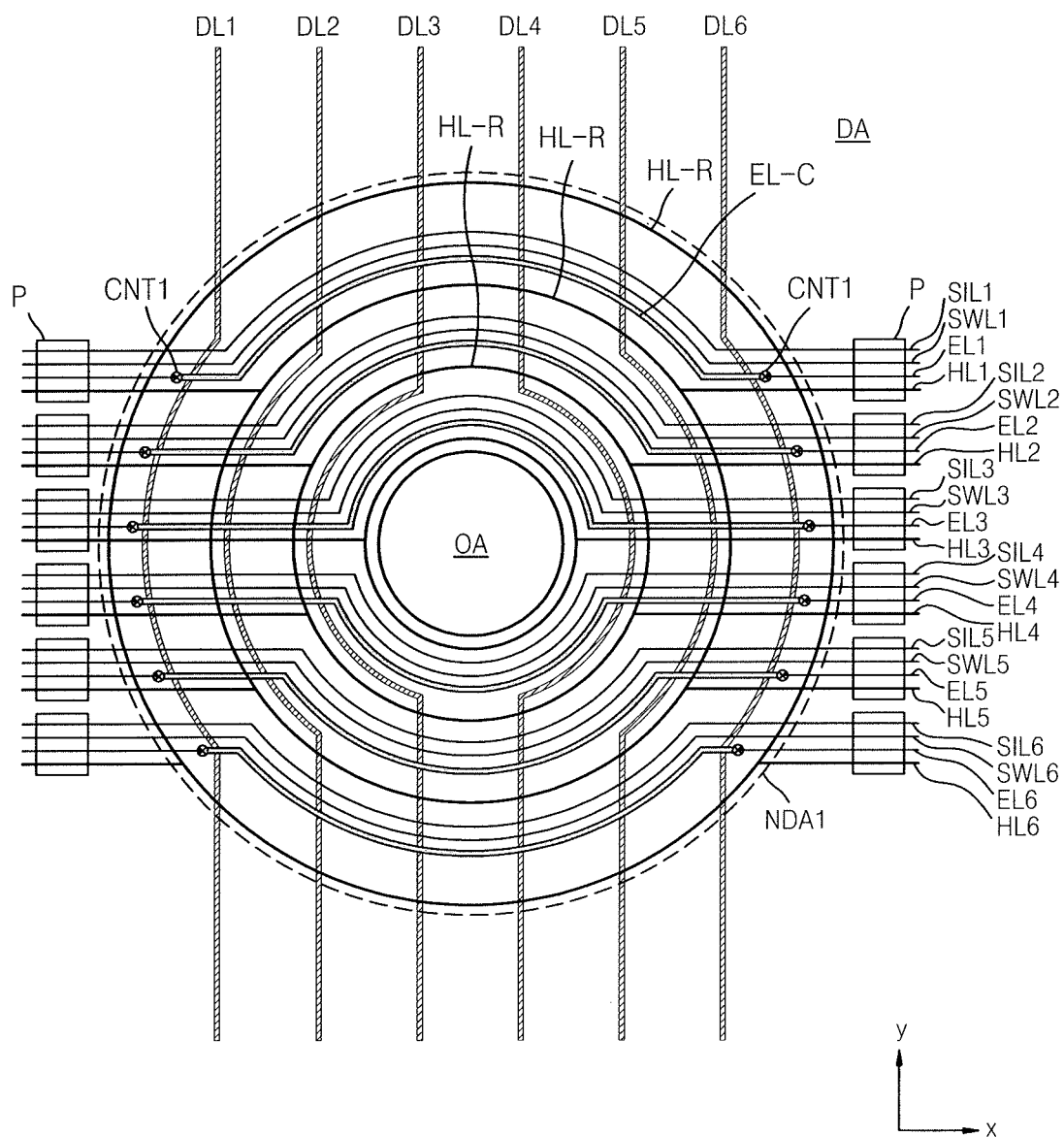
FIGS. 12 and 13 illustrate plan views of lines around an opening area in a display panel according to another embodiment.
Figure 13:
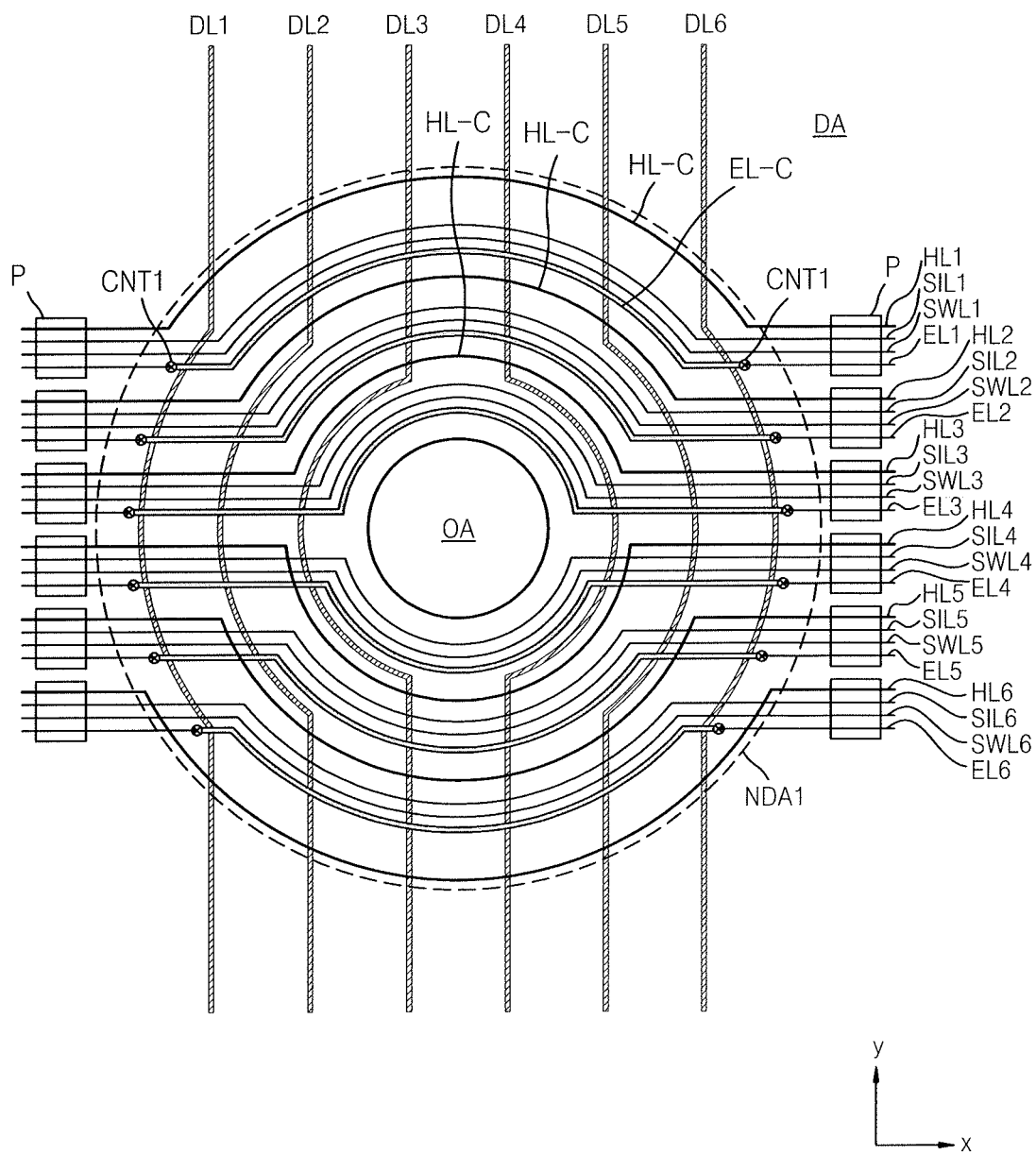

FIGS. 12 and 13 illustrate plan views of lines around the opening area OA in the display panel 10 according to another embodiment. Referring to FIGS. 12 and 13, each pixel P includes an electrode voltage line. With regard to this, FIGS. 12 and 13 show first to sixth electrode voltage lines HL1, HL2, HL3, HL4, HL5, and HL6. For convenience of description, though FIGS. 12 and 13 extract and show the first to sixth scan lines SWL1, SWL2, SWL3, SWL4, SWL5, and SWL6, the first to sixth previous scan lines SIL1 SIL2, SIL3, SIL4, SIL5, and SIL6, the first to sixth emission control lines EL1, EL2, EL3, EL4, EL5, and EL6, and the first to sixth data lines DL1, DL2, DL3, DL4, DL5, and DL6 among the lines shown in FIG. 8, the display panels 10 of FIGS. 12 and 13 may include all of the elements described with reference to FIG. 8 in another embodiment. Since the same elements as those of FIG. 8 among elements shown in FIGS. 12 and 13 are described above with reference to FIG. 8, descriptions thereof may be omitted and difference are mainly described below.

Referring to FIG. 12, in an embodiment, the first to sixth electrode voltage lines HL1, HL2, HL3, HL4, HL5, and HL6 of pixels P that extend in the x-direction in the display area DA may be connected to each other in the first non-display area NDA1. The first to sixth electrode voltage lines HL1, HL2, HL3, HL4, HL5, and HL6 that are connected to each other may be connected to a plurality of connection electrodes HL-R (or ring electrodes) surrounding the opening area OA in the first non-display area NDA1. Each of the connection electrodes HL-R may have a ring shape.

The connection electrodes HL-R may be arranged to form a centric shape around the opening area OA and connected to the first to sixth electrode voltage lines HL1, HL2, HL3, HL4, HL5, and HL6 to form a radial mesh shape as shown in FIG. 12.

As described with reference to FIGS. 7A and 7B, the first to sixth electrode voltage lines HL1, HL2, HL3, HL4, HL5, and HL6 may be arranged on the first interlayer insulating layer 2143. The plurality of connection electrodes HL-R may be arranged on the same layer as a layer on which the first to sixth electrode voltage lines HL1, HL2, HL3, HL4, HL5, and HL6 are arranged, and may include the same material as that of the first to sixth electrode voltage lines HL1, HL2, HL3, HL4, HL5, and HL6 and may be formed as one body with the first to sixth electrode voltage lines HL1, HL2, HL3, HL4, HL5, and HL6.

The connection electrodes HL-R having a ring shape may be between detouring portions of neighboring data lines in the first non-display area NDA1. The connection electrodes HL-R having a voltage level of a constant voltage may reduce coupling between the detouring portions of the neighboring data lines.

Referring to FIG. 13, in another embodiment, each of the first to sixth electrode voltage lines HL1, HL2, HL3, HL4, HL5, and HL6 may include the detouring portion HL-C that detours around the edge of the opening area OA. The detouring portion HL-C of each of the first to sixth electrode voltage lines HL1, HL2, HL3, HL4, HL5, and HL6 may be arranged between the detouring portions of the neighboring data lines to reduce coupling therebetween.

Figure 14:
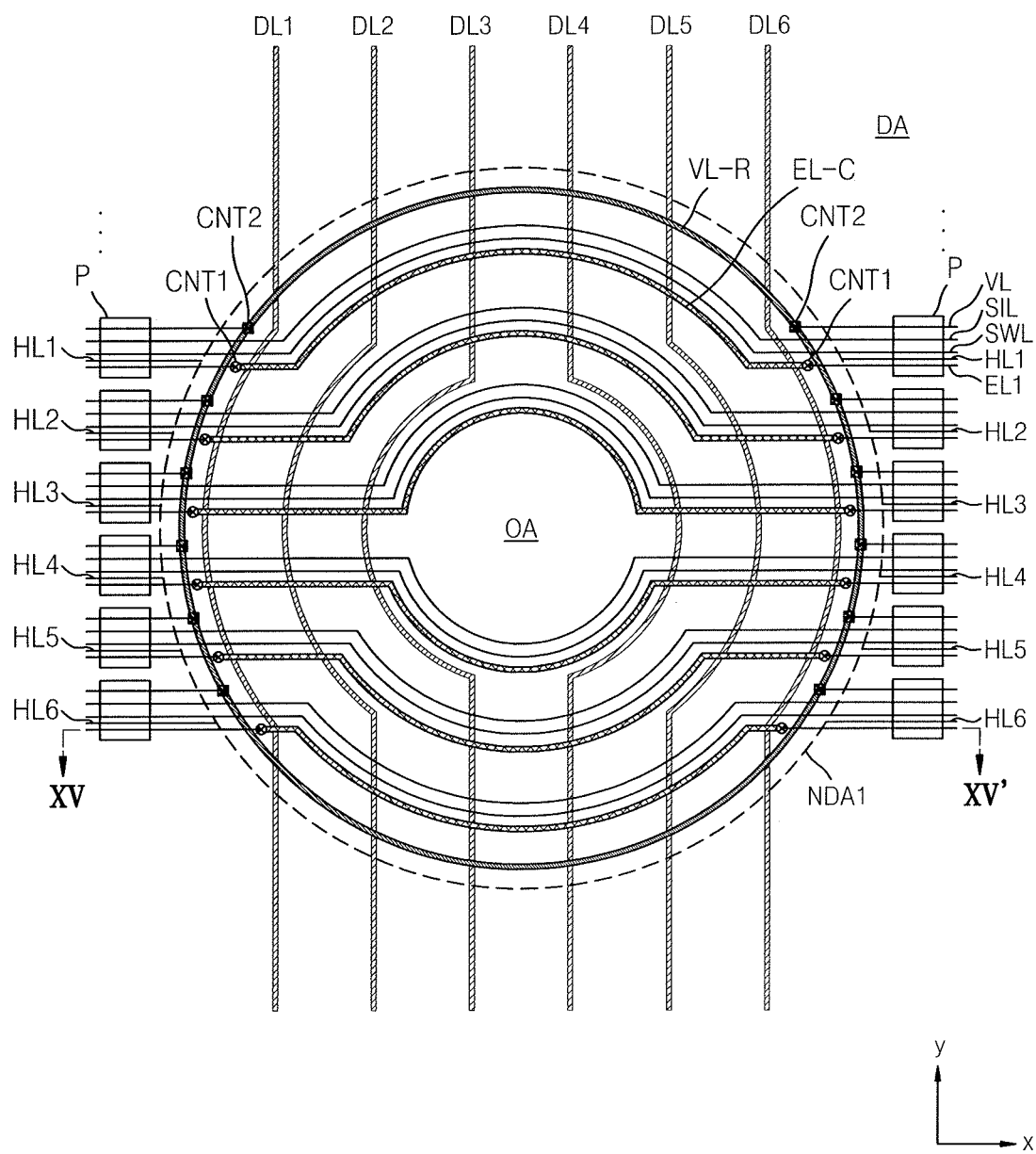
FIG. 14 illustrates a plan view of lines around an opening area in a display panel according to another embodiment.
Figure 15:
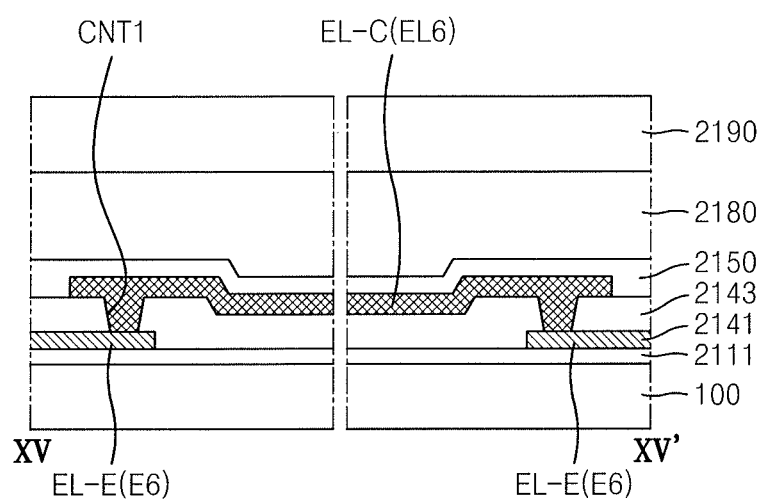
FIG. 15 illustrates a cross-sectional view taken along a line XV-XV' of FIG. 14.

FIG. 14 illustrates a plan view of lines around the opening area OA in the display panel 10 according to another embodiment, and FIG. 15 illustrates a cross-sectional view taken along line XV-XV' of FIG. 14. When compared to the lines described with reference to FIGS. 8 to 10, the lines provided to the display panel 10 of FIG. 15 are different in a stacking structure of the detouring portion EL-C of the emission control line and descriptions of the other lines are the same as the descriptions made above with reference to FIGS. 8 to 10.

Referring to FIGS. 14 and 15, the detouring portion EL-C may be arranged on the first interlayer insulating layer 2143. For example, the extension portions EL-E of the sixth emission control line EL6 arranged on the gate insulating layer 2141 may be connected to the detouring portion EL-C located on the first interlayer insulating layer 2143 through the first contact hole CNT1.

Referring to FIG. 14, the display panel 10 may include the electrode voltage line. With regard to this, FIG. 14 shows the first to sixth electrode voltage lines HL1, HL2, HL3, HL4, HL5, and HL6 connected to pixels on left and right sides around the opening area OA.

The first to sixth electrode voltage lines HL1, HL2, HL3, HL4, HL5, and HL6 may be spaced apart from each other around the opening area OA. As described above with reference to FIG. 7B, the first to sixth electrode voltage lines HL1, HL2, HL3, HL4, HL5, and HL6 that are spaced from each other may constitute a mesh structure with the driving voltage line. Therefore, even though the electrode voltage lines HL are spaced apart from each other around the opening area OA, the electrode voltage lines HL may maintain the same voltage level.

The structure of the electrode voltage lines described with reference to FIG. 15 is equally applicable to the embodiment described above with reference to FIG. 8 and an embodiment which will be described below with reference to FIG. 16, and/or embodiment(s) derived therefrom.

Figure 16:
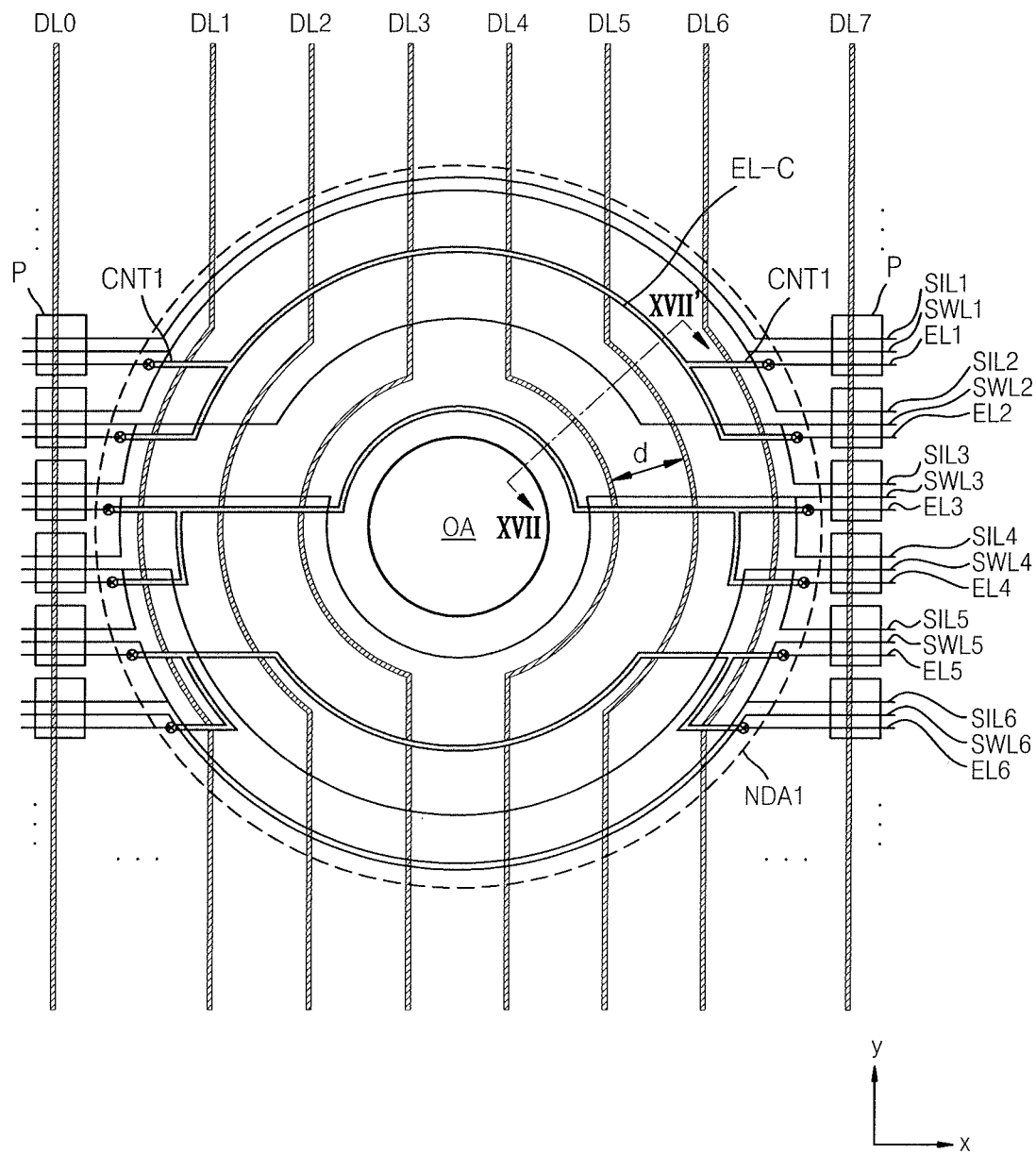
FIG. 16 illustrates a plan view of lines around an opening area in a display panel according to another embodiment.
Figure 17:
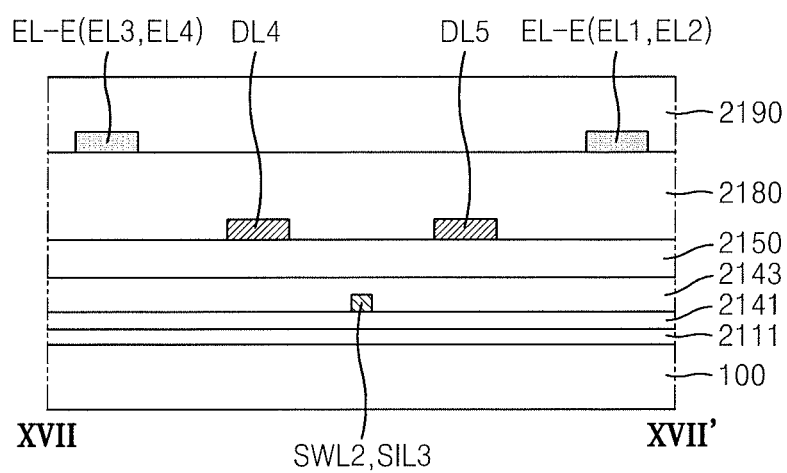
FIG. 17 illustrates a cross-sectional view taken along a line XVII-XVII' of FIG. 16.

FIG. 16 illustrates a plan view of lines around the opening area OA in the display panel 10 according to another embodiment, and FIG. 17 illustrates a cross-sectional view taken along line XVII-XVII' of FIG. 16.

Referring to FIG. 16, in the first non-display area NDA1, a scan line of one of neighboring pixels may be connected to a previous scan line of another pixel. For example, the first scan line SWL1 on a first row that transfers a scan signal to pixels P arranged on the left and right of the opening area OA may be connected to the second previous scan line SIL2 on a second row in the first non-display area NDA1. For example, in the first non-display area NDA1, the second previous scan line SIL2 may be connected to the detouring portion of the first scan line SWL1. In another aspect, in the first non-display area NDA1, the first scan line SWL1 may be connected to the detouring portion of the second previous scan line SIL2. For example, the first scan line SWL1 and the second previous scan line SIL2 may share the detouring portion. According to the embodiment described with reference to FIG. 8, the detouring portion of the second previous scan line SIL2 and the detouring portion of the first scan line SWL1 may individually detour around the edge of the opening area OA. In the embodiment shown in FIG. 16, the second previous scan line SIL2 and the first scan line SWL1 may detour around the edge of the opening area OA along one detouring line, e.g., one detouring portion. For example, the number of scan lines and previous scan lines that pass across the first non-display area NDA1 may be reduced.

Likewise, the second scan line SWL2 on a second row that transfers a scan signal to pixels P arranged on the left and right of the opening area OA may be connected to the third previous scan line SIL3 on a third row in the first non-display area NDA1. The third scan line SWL3 on a third row may be connected to the fourth previous scan line SIL4 on a fourth row in the first non-display area NDA1, the fourth scan line SWL4 on a fourth row may be connected to the fifth previous scan line SIL5 on a fifth row in the first non-display area NDA1, and the fifth scan line SWL5 on a fifth row may be connected to the sixth previous scan line SIL6 on a sixth row in the first non-display area NDA1.

In an implementation, as illustrated in in FIG. 16, an N-th previous scan line may be connected to a detouring portion of an (N−1)-th scan line. In an implementation, an (N−1)-th scan line may be connected to a detouring portion of an N-th previous scan line (N is an integer).

In the first non-display area NDA1, an emission control line of one of neighboring pixels may be connected to an emission control line of another pixel. For example, the first emission control line EL1 on a first row that transfers an emission control signal to pixels P arranged on the left and right of the opening area OA may be connected to the second emission control line EL2 on a second row in the first non-display area NDA1. For example, in the first non-display area NDA1, the second emission control line EL2 may be connected to the detouring portion EL-C of the first emission control line EL1. According to the embodiment described with reference to FIG. 8, the detouring portions EL-C respectively of the first and second emission control lines EL1 and EL2 individually detour around the edge of the opening area OA. According to the embodiment shown in FIG. 16, the first and second emission control lines EL1 and EL2 may detour around the edge of the opening area OA along one detouring line, that is, one detouring portion EL-C. For example, the number of emission control lines, that is, the number of detouring lines respectively of the emission control lines that pass across the first non-display area NDA1 may be reduced.

Likewise, the third emission control line EL3 on a third row may be connected to the fourth emission control line EL4 on a fourth row in the first non-display area NDA1, and the fifth emission control line EL5 on a fifth row may be connected to the sixth emission control line EL6 on a sixth row in the first non-display area NDA1.

In an implementation, an N-th emission control line may be connected to a detouring portion of an (N−1)-th emission control line. In an implementation, an (N−1)-th emission control line may be connected to a detouring portion of an N-th emission control line (N is an integer). As described above, in the case where the (N−1)-th scan line and the N-th previous scan line are connected to each other, and the (N−1)-th emission control line and the N-th emission control line are connected to each other, the detouring portions of the scan line and the previous scan line that are connected to each other and the detouring portions of the emission control lines that are connected to each other may be alternatively arranged. Referring to FIGS. 16 and 17, the detouring portions of the emission control lines that are connected to each other, the detouring portions of the scan line and the previous scan line that are connected to each other, and the detouring portions of the emission control lines that are connected to each other may be sequentially arranged between detouring portions of neighboring data lines in a radial direction from the center of the opening area OA.

In an implementation, as illustrated in FIG. 16, the (N−1)-th scan line and the N-th previous scan line may be connected to each other, and the (N−1)-th emission control line and the N-th emission control line may be connected to each other. In an implementation, the (N−1)-th scan line and the N-th previous scan line may be connected to each other, and the (N−1)-th emission control line and the N-th emission control line may not be connected to each other. In another embodiment, the (N−1)-th emission control line and the N-th emission control line are connected to each other, and the (N−1)-th scan line and the N-th previous scan line may not be connected to each other.

In an implementation, the connection electrode HL-R (see FIG. 12) having the ring shape described with reference to FIGS. 12 and 13 may be included, or the power voltage lines HL1, HL2, HL3, HL4, HL5, and HL6, each including the connection electrode HL-C (see FIG. 13) having an arc shape may be provided to FIG. 16, and as described above with reference to FIG. 14, the power voltage lines HL1, HL2, HL3, HL4, HL5, and HL6 that are spaced apart from each other with the opening area OA therebetween may be provided.

Figure 18:
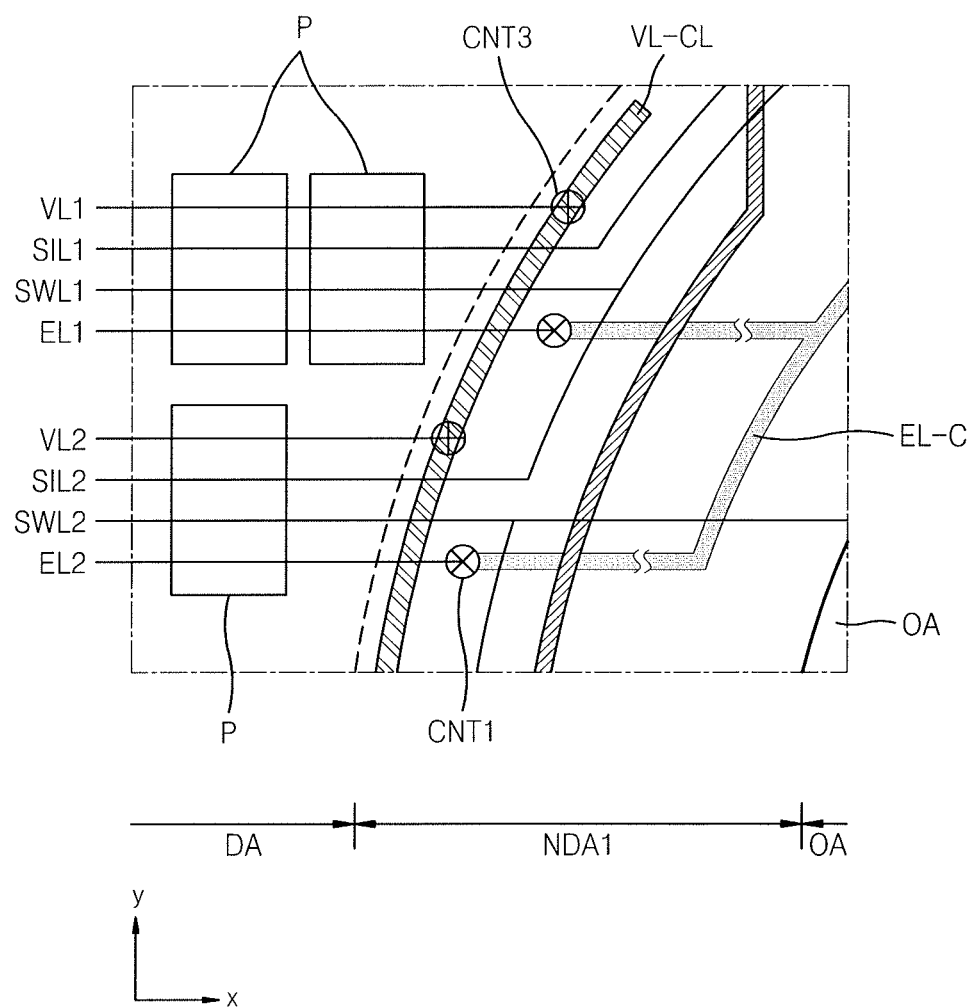
FIG. 18 illustrates a plan view of a portion of a display panel according to another embodiment.

FIG. 18 illustrates a plan view of a portion of the display panel 10 according to another embodiment.

Referring to FIG. 18, as described with reference to FIG. 16, the first scan line SWL1 and the second previous scan line SIL2 may be connected to each other and thus one detouring line (detouring portion) may pass across the first non-display area NDA1, and the first and second emission control lines EL1 and EL2 may be connected to each other and thus one detouring line (detouring portion) may pass across the first non-display area NDA1. In an implementation, the display panel 10 may include the lines having the same structures as those of the display panel 10 described above with reference to FIG. 16 in addition to the first scan line SWL1, the second previous scan line SIL2, and the first and second emission control lines EL1 and EL2.

Two or more initialization voltage lines arranged on the left of the first non-display area NDA1 may be connected to each other. For example, as shown in FIG. 18, the first initialization voltage line VL1 that transfers an initialization voltage to pixels P on a first row and the second initialization voltage line VL2 that transfers an initialization voltage to pixels P on a second row may be connected to an electrode layer VL-CL of a bar type or a linear type. The electrode layer VL-CL may be arranged on a layer different from a layer on which the first and second initialization voltage lines VL1 and VL2 are arranged. For example, the electrode layer VL-CL arranged on the same layer as a layer on which a data line is arranged may be connected to the first and second initialization voltage lines VL1 and VL2 arranged thereunder through a third contact hole CNT3. In an implementation, two or more initialization voltage lines arranged on the right of the first non-display area NDA1 may be also electrically connected to each other through the electrode layer which is located on a right side of the opening area OA.

As a way of increasing the variety of functions that may be combined or associated with the display device, one or more embodiments may provide a display panel including an opening area in which a camera, sensor, etc. may be arranged inside a display area, and an apparatus including the display panel.

Embodiments may help prevent interference between lines (wirings) around the opening area, for example, coupling between neighboring data lines in the display device including the opening area (or the opening), and reduce an area of the non-display area occupied by lines around the opening area.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display panel, comprising:
a substrate including a display area surrounding an opening area and a non-display area between the opening area and the display area;
a plurality of display elements in the display area;
a plurality of scan lines extending in a first direction in the display area and detouring around the opening area in the non-display area;
a plurality of data lines extending in a second direction crossing the first direction in the display area, the plurality of data lines detouring around the opening area in the non-display area;
a plurality of voltage lines extending in the second direction in the display area; and
a plurality of electrode voltage lines extending in the first direction in the display area and electrically connected to the plurality of voltage lines, wherein the plurality of voltage lines and the plurality of electrode voltage lines form a mesh structures in a plan view.

2. The display panel as claimed in claim 1, further comprising:
a plurality of circuits electrically coupled to the plurality of display elements, respectively, wherein each of the plurality of circuits includes transistors and a capacitor, wherein the capacitor comprises a first capacitor electrode and a second capacitor electrode that is electrically connected the plurality of electrode voltage lines.

3. The display panel as claimed in claim 2, wherein a portion of each of the plurality of electrode voltage lines includes the second capacitor electrode of the capacitor.

4. The display panel as claimed in claim 1, wherein the plurality of electrode voltage lines comprises a first electrode voltage line including a first part and a second part that are spaced each other with the opening area therebetween.

5. The display panel as claimed in claim 1, further comprising:
a first insulation layer between the plurality of scan lines and the plurality of electrode voltage lines.

6. The display panel as claimed in claim 5, further comprising:
a second insulation layer between the plurality of electrode voltage lines and the plurality of data lines, wherein the second insulation layer is over the first insulation layer.

7. A display panel, comprising:
a substrate having a hole, the substrate including a display area surrounding the hole and a non-display area between the hole and the display area;
a plurality of display elements in the display area;
a plurality of scan lines extending in a first direction in the display area and detouring around the hole in the non-display area;
a plurality of data lines extending in a second direction crossing the first direction in the display area, the plurality of data lines detouring around the hole in the non-display area;
a plurality of voltage lines extending in the second direction in the display area; and
a plurality of electrode voltage lines extending in the first direction in the display area and electrically connected to the plurality of voltage lines, wherein the plurality of voltage lines and the plurality of electrode voltage lines form a mesh structures in a plan view.

8. The display panel as claimed in claim 7, further comprising:
a plurality of circuits electrically coupled to the plurality of display elements, respectively, wherein each of the plurality of circuits includes transistors and a capacitor, wherein the capacitor comprises a first capacitor electrode and a second capacitor electrode that is electrically connected the plurality of electrode voltage lines.

9. The display panel as claimed in claim 8, wherein a portion of each of the plurality of electrode voltage lines includes the second capacitor electrode of the capacitor.

10. The display panel as claimed in claim 7, wherein the plurality of electrode voltage lines comprises a first electrode voltage line including a first part and a second part that are spaced each other,
wherein the hole of the substrate is between the first part and the second part of the first electrode voltage line in a plan view.

11. The display panel as claimed in claim 7, further comprising:
a first insulation layer between the plurality of scan lines and the plurality of electrode voltage lines; and
a second insulation layer over the first insulation layer, wherein the plurality of electrode voltage lines are under the second insulation layer and the plurality of data lines are over the second insulation layer.

12. A display device, comprising:
a display panel including a hole area and a display area surrounding the hole area; and
a component located in the hole area of the display panel, wherein the display panel comprises:
a substrate having a hole corresponding to the hole area of the display panel;

a plurality of light emitting diodes on the substrate, the plurality of light emitting diodes being arranged in the display area;

a plurality of circuits electrically coupled to the plurality of light emitting diodes, respectively, wherein each of the plurality of circuits includes transistors and a capacitor;

a plurality of scan lines electrically coupled to the plurality of circuits, the plurality of scan lines extending in a first direction in the display area and detouring along an edge of the hole of the substrate in an area between the hole area and the display area;

a plurality of data lines extending in a second direction crossing the first direction in the display area, and detouring along an edge of the hole of the substrate in the area between the hole area and the display area;

a plurality of voltage lines extending in the second direction in the display area; and a plurality of electrode voltage lines extending in the first direction in the display area and electrically connected to the plurality of voltage lines, wherein the plurality of voltage lines and the plurality of electrode voltage lines form a mesh structures in a plan view.

13. The display device as claimed in claim 12, wherein the capacitor comprises a first capacitor electrode and a second capacitor electrode that is electrically connected the plurality of electrode voltage lines.

14. The display device as claimed in claim 13, wherein a portion of each of the plurality of electrode voltage lines includes the second capacitor electrode of the capacitor.

15. The display device as claimed in claim 12, wherein the plurality of electrode voltage lines comprises a first electrode voltage line including a first part and a second part that are spaced each other with the hole of the substrate therebetween.

16. The display device as claimed in claim 1, wherein the display panel further comprises:
a first insulation layer between the plurality of scan lines and the plurality of electrode voltage lines; and
a second insulation layer over the first insulation layer, wherein the plurality of electrode voltage lines are under the second insulation layer and the plurality of data lines are over the second insulation layer.

17. The display device as claimed in claim 1, wherein the component comprises an electronic element that uses light or sounds.

18. The display device as claimed in claim 17, wherein the electronic element uses at least one selected from a visible light, an infrared light, and ultraviolet light.

19. The display device as claimed in claim 17, wherein the electronic element comprises at least one selected from a camera, a distance sensor, a fingerprint sensor, a small lamp, and a speaker.

20. The display device as claimed in claim 17, wherein the display device comprises a mobile phone, a notebook computer, and a smartwatch.

* * * * *